US006334100B1

(12) United States Patent
Ahrikencheikh et al.

(10) Patent No.: US 6,334,100 B1
(45) Date of Patent: Dec. 25, 2001

(54) METHOD AND APPARATUS FOR ELECTRONIC CIRCUIT MODEL CORRECTION

(75) Inventors: Cherif Ahrikencheikh; Rodney A. Browen, both of Loveland; William P. Darbie, Longmont; Kay C. Lannen, Ft. Collins; John E. McDermid, Loveland; Jamie P. Romero, Ft. Collins, all of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/169,502

(22) Filed: Oct. 9, 1998

(51) Int. Cl.[7] ............................. G06F 17/50; G06F 11/00; G06F 19/00; G01R 31/00
(52) U.S. Cl. ................................. 703/14; 703/4; 703/20; 714/741; 702/57; 702/58
(58) Field of Search ............................... 703/2, 4, 14, 20; 714/736, 741, 742, 25, 37; 702/57, 58

(56) References Cited

U.S. PATENT DOCUMENTS

| | | | |
|---|---|---|---|
| 5,049,814 | * 9/1991 | Walker, III et al. | 714/736 |
| 5,177,440 | * 1/1993 | Walker, III et al. | 714/736 |
| 5,349,539 | * 9/1994 | Moriyasu | 395/500.36 |
| 5,446,742 | * 8/1995 | Vahabi et al. | 714/744 |
| 5,452,227 | * 9/1995 | Kelsey et al. | 364/489 |
| 5,793,640 | * 8/1998 | Wu et al. | 702/65 |
| 5,808,919 | 9/1998 | Preist et al. | 364/579 |
| 5,946,214 | * 8/1999 | Heavlin et al. | 365/200 |

OTHER PUBLICATIONS

Jri Vlach and Kishore Singhal, "Computer Methods For Circuit Analysis and Design," Van Nostrand Reinhold Publishing, New York, NY, 1983, Chapter 4, "General Formulation Methods," pp. 100–151, Chapter 5, "Sensitivities." pp. 152–170.

Leon O. Chua and Pen–Min Lin, "Computer–Aided Analysis of Electronic Circuits: Algorithms and Computational Techniques,", Prentice–Hall, 1975, Chapter 4, "Nodal Linear Network Analysis: Algorithms and Computational Methods," pp. 166–203, Chapter 17, Advanced Algorithms and Computational Techniques for Computer Simulation Programs, pp. 665–717.

Yoshio Togawa, Takashi Matsumoto, & Hideki Arai, "The Tf–Equivalence Class Approach to Analog Fault Diagnosis Problems", IEEE Transactions on Circuits and Systems, vol. CAS–33, No. 10, Oct. 1986, pp. 992–1009.

Jiri Vlach and Kishore Singhal, Computer Methods for Circuit Analysis and Design, Van Nostrand Reinhold Publishing, New York, NY, 1983.

Leon O. Chau & Pen–Min Lin, Computer Aided Analysis of Electronic Circuits: Algorithms and Computational Techniques, Prentis Hall, 1975.

Gary D. Hactel, Robert K. Brayton, and Fred G. Gustavson, "The Sparse Tableu Approach to Network Analysis and Design" IEEE Transactions on Circuit Theory, vol. CT–18, No. 1, Jan. 1971, pp. 101–113.

Kenneth P. Parker, John e. McDermid and Stig Oresjo "Structure and Metrology for an Analog Testability Bus" Proceeding of the IEEE International Test Conference, Baltimore, Maryland, Oct. 1993, pp. 309–322.

(List continued on next page.)

Primary Examiner—Kevin J. Teska
Assistant Examiner—William Thomson

(57) ABSTRACT

A method for evaluating and correcting a model of an electronic circuit. A list is created which comprises the minimum number of components that must be specified by the operator in order to be able to compute values for the remaining circuit components. Correction of circuit models can be performed even in cases of limited accessibility to the circuit's nodes.

28 Claims, 5 Drawing Sheets

OTHER PUBLICATIONS

Juin–Land Huang & Kwang–Ting Cheng "Analog Fault Diagnosis for Unpowered Circuit Boards" Proceedings of the IEEE International Test Conference, Washington, DC, Nov. 1997, pp. 640–648.

John McDermid "Limited Access Testing: IEEE 1149.4 Instrumentation & Method", Proceeding of the IEEE International Test Conference, Oct. 1998, pp. 388–395.

John McDermid, "Limited Access Testing: Ability and Requirements" Proceedings of the Technical Program. NEPCON West '98, Mar. 1998, vol. 2, pp. 736–742.

R. Lui, Testing and Diagnosis of Analog Circuits and Systems, Van Nostrand & Reihold, NY, 1991.

S.D. Bedrosian, "On Element Value Solution of Single–Element–Kind Networks", Ph. D. Dissertation, University of Pennsylvania, Dec. 1961.

Timothy N. Trick, Wataru Mayeda, and Adel A. Sakla, "Calculation of Parameter Values from Node Voltage Measurements", IEEE Transactions on Circuits and Systems, vol. CAS–26, No. 7, pp. 466–474, Jul. 1979.

Zheng F. Huang, Chen–Shang Lin & Ruey–Wen Liu, "Node–Fault Diagnosis and a Design of Testability", IEEE Transactions on Circuits and Systems, vol. CAS–30, No. 5, pp. 257–265, May 1983.

R.M. Biernacki and J.W. Bandler, "Fault Location of Analog Circuits", Proceedings of the 1980 IEEE International Symposuim on Circuits & Systems, NY, 1980, pp. 1078–1081.

R. S. Berkowitz, "Conditions for Network–Element–Value Solvability", IRE Transactions on Circuit Theory, Mar. 1962, pp. 24–29.

L. Rapisarda & R.A. Decarlo, "Analog Multifrequency Fault Diagnosis", IEEE Transactions of Circuits & Systems, vol. CAS–30, No. 4, pp. 223–234, Apr. 1983

Kwang–Ting (Tim) Cheng, "Test Point Selections for Analog Fault Diagnosis", Proposal Department of Electrical & Computer Engineering, University of California—Santa Barbarba to Hewlett–Packard Company, 1996.

* cited by examiner

| MODEL ELEMENT IDENTIFIER | MODEL ELEMENT TYPE | FIRST NODE CONNECTION | SECOND NODE CONNECTION | NOMINAL MODEL COMPONENT VALUE | MODEL TOLERANCE |
|---|---|---|---|---|---|
| 515 | 520 | 525 | 530 | 535 | 540 |

FIG.5

METHOD AND APPARATUS FOR ELECTRONIC CIRCUIT MODEL CORRECTION

CROSS REFERENCE TO RELATED APPLICATIONS

A number of related co-pending United States patent applications commonly owned by the assignee of the present document and incorporated by reference in their entirety into this document are being filed in the United States Patent and Trademark Office on or about Oct. 9, 1998. The list of these applications is as follows: Hewlett Packard Company Ser. No. 09/169,320, entitled "METHOD AND APPARATUS FOR LIMITED ACCESS CIRCUIT TEST"; Hewlett Packard Company Ser. No. 09/169,597, entitled "METHOD AND APPARATUS FOR SELECTING STIMULUS LOCATIONS DURING LIMITED ACCESS CIRCUIT TEST"; Hewlett Packard Company Ser. No. 09/169,777, entitled "METHOD AND APPARATUS FOR SELECTING TARGETED COMPONENTS IN LIMITED ACCESS TEST"; Hewlett Packard Company Ser. No. 09/169,710, entitled Hewlett Packard Company Ser. No. 09/169,421, entitled "METHOD AND APPARATUS FOR SELECTING TEST POINT NODES FOR LIMITED ACCESS CIRCUIT TEST"; and Hewlett Packard Company Ser. No. 09/169,709, entitled "METHOD AND APPARATUS FOR CORRECTING FOR DETECTOR INACCURACIES IN LIMITED ACCESS TESTING".

FIELD OF THE INVENTION

The present invention relates generally to electronic test machines and methods, more particularly to electronic test machines that test printed circuit boards on which electronic components have been mounted or loaded, and even more particularly to printed circuit board electronic models.

BACKGROUND OF THE INVENTION

Printed circuit board modeling includes creating a faithful numerical description of all devices on a board and their interconnections. This description includes the designators of the devices, their type (resistor, capacitor, inductor, diode, transistor, etc.), their nominal values, the acceptable ranges of tolerance for these values, and the accessibility of interconnections for test probe locations. When such a model is obtained for a board that is known to be good, it can be used on the production line to automatically verify the correctness of newly manufactured boards of the same type. Board models, therefore, play an important role in board manufacturing. If the model used is not correct, good boards may be classified as bad resulting in the wasting of valuable resources, or bad boards may be classified as good resulting in bad boards that are not detected until late in the manufacturing process by functional test. It is essential, therefore, to devise a means to verify board models and correct errors in them before they are used to verify other boards.

Board models are usually created from computer aided design (CAD) data. Errors that occur during data entry or part specification result in erroneous models that need to be corrected. A brute-force method for model correction would be to visually inspect every device on the board, verifying its description in the model. Clearly, with the ever-increasing complexity of today's circuit boards, this method is not practical. Another method is to use the model to simulate the board functions then verify if the results satisfy the mission for which the board was designed. This method, however, may only conclude that a model is correct or incorrect, without indication as to which devices were modeled incorrectly. In addition, the stimuli and frequencies used in the testing environment are usually different from those used in the operating environment for which the board was designed. As a result, a board can behave in an unexpected manner in the test environment. Thus, differences between the model's behavior and that of the tested board do not necessarily indicate that the model is erroneous.

Including the two methods mentioned above, the existing methodologies for correcting board models fall into the following categories:

(1) Visual inspection of every device on the board. As stated above, with the ever-increasing complexity of today's circuit boards, this method is not practical.

(2) Simulate board function using the model and verify whether or not simulation results satisfy the purpose or mission for which the board was designed. Simulation would most likely be performed via a computer program designed for this purpose. A set of parameters, referred to as mission parameters, whose values are crucial to the circuit correctly performing its designed purpose or mission are simulated for the model and compared against those of the real board. If these are essentially similar, the model can be considered correct. Otherwise, the model is identified as being incorrect without necessarily indicating which device or devices were incorrectly modeled. Attempts have been made to build so-called fault dictionaries that match mission parameters to component values by using various heuristics. Such dictionaries would indicate which component of the model is incorrect. However, fault dictionaries are not found to be very successful in practice.

(3) When all nodes of a circuit are accessible, in circuit testers, such as those manufactured by Hewlett Packard (HP3060, HP3065, and HP3070), GenRad, Teradyne, and others, can be used to make electrical measurements at each of the nodes. These measurements can be used to calculate the parameters for each device, and the resulting calculated values can be compared to those specified for the device in the model. If a match is found for all devices, the model is correct. Otherwise, the model can be corrected one device at a time. This method, however, assumes access to all nodes of the circuit, and therefore is not applicable in limited access situations. Techniques exist that allow finding faulty components in limited access situations, but the number of simultaneous faults must be small enough for the computation time to be reasonable.

(4) Manufacturing Defect Analyzers (MDA's) can measure voltages on accessible nodes to learn nodal impedances and report a pass/fail result for the circuit based on these results. In this case, however, there is no indication as to which devices are incorrectly modeled.

To be able to correctly identify components in an electronic circuit which fail to meet desired specification, it is first necessary to have an accurate description or model of the circuit. Methods previously used to confirm the accuracy of complex circuits are time consuming and wasteful of resources, have questionable accuracy, and/or do not provide sufficient resolution to be able to identify components that have been modeled incorrectly. Thus, with the increasing complexity and cost of modem electronic printed circuit boards, there is a pressing need for techniques that can easily and accurately identify those components that have been incorrectly modeled.

SUMMARY OF THE INVENTION

In a representative embodiment, methods are provided for efficiently comparing the model of an electronic circuit, which consists of a numerical description of all its components and their interconnections, to that of an actual circuit. Accurate modeling of an electronic circuit is one of the important steps necessary in an effective board test strategy. Without a complete, accurate board model, it is difficult to accurately test complex, modern electronic printed circuit boards. The representative embodiment provides methods for identifying which components are most likely to have been modeled incorrectly. Individual components, on increasingly complex boards, do not have to be individually tested and complete information is provided which describes incorrectly modeled components.

In a representative embodiment, a numerical model of an electronic circuit is obtained from Computer Aided Design (CAD) data or by other means. This data is compared with electrical measurements made on a physical circuit such as would be fabricated on a printed circuit board. A model correction computer program compares the electronic test data against predictions of the model and a minimum list of components which must be specified in order for the program to fully compare the model to the real circuit is created. The operator then inputs values for those components which he knows to be valid based, for example, upon direct inspection and/or measurement. The computer program then creates a new list of components which must be specified. This process continues until there are no remaining components on the list. The computer program then computes the values and types of all remaining components that have not been specified. Should any components have values that lie outside the tolerance limits of that component, the component is identified for subsequent verification by the operator.

The computer program creates a set of linear equations which numerically describes the circuit and uses a method based on the "best-first-search technique" to identify the equations that contain the shortest list of unknowns. This list comprises the fewest components that the operator should specify in order for the program to calculate the values and types of the remaining components.

In a representative embodiment, test voltages are alternating current (AC) signals whose peak values are small enough that active devices such as transistors and integrated circuits will not be activated. In this case, active devices can be modeled either in terms of their parasitic effects upon the circuit or simply as open circuits. These effective open circuits often divide the circuit up into clusters which can be tested and analyzed separately. A cluster is defined to have at most one node in common with any other part of the circuit, and therefore, is effectively isolated from the rest of the circuit board. In some cases, it is advantageous to further divide a complex cluster into smaller sub-clusters by the judicious use of temporary short circuits and then to perform the above verification process on each sub-cluster.

In a representative embodiment, test voltages applied to the electronic circuit may have any value which does not damage the circuit. In another representative embodiment, electrical test voltages are small enough such that active devices on the electronic circuit are not turned on. For modern integrated circuits fabricated in silicon, such test voltages should be less than approximately the 0.7 volts forward bias voltage of a P-N junction, but more preferably less than or equal to 0.2 volts. Circuits having active devices fabricated from other materials or based on different technologies, as for example gallium arsenide devices and vacuum tubes, may have either lesser or greater turn-on voltages and, therefore, lesser or greater allowed maximum test voltages. In still another embodiment, test voltages may be direct current (DC) signals rather than AC.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements and:

FIG. 5 is a drawing of a representative data structure for a model element of a model of an electronic circuit consistent with an embodiment of the present invention.

DESCRIPTION OF THE PREFERRED EMBODIMENT

1. Introduction

Figure 1:
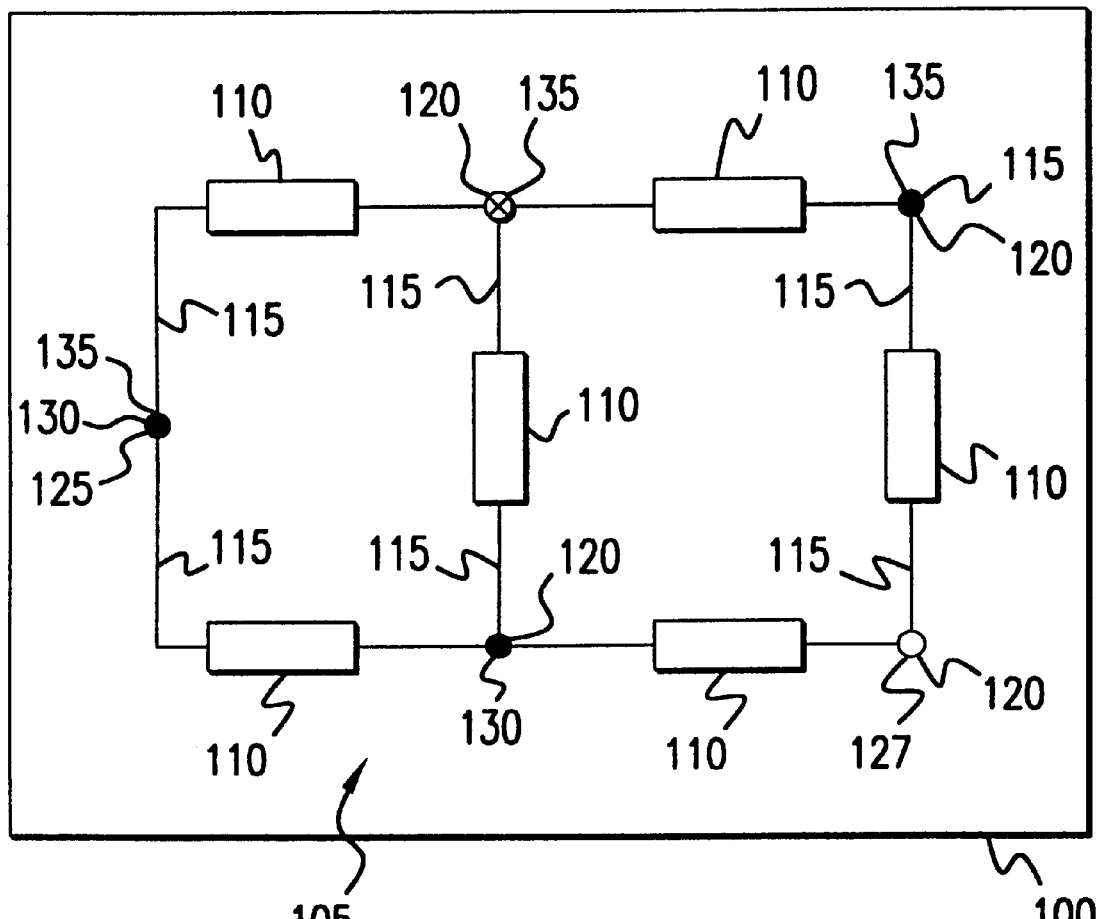
FIG. 1 is a drawing of an electronic circuit on a printed circuit board consistent with an embodiment of the present invention.

As shown in the drawings for purposes of illustration, the present invention relates to a method for correcting an electronic circuit model which consists of a numerical description of its devices and their interconnections so that it agrees with an actual physical board. It is desirable to have a method for correcting the model that does not have to verify every individual component on increasingly complex boards and which provides complete information regarding missing or incorrectly modeled components. In the following detailed description and in the several figures of the drawings, like elements are identified with like reference numerals.

2. Definitions

Electronic Circuit

The electronic circuit of a printed circuit board is comprised of the electronic devices on the board and their interconnections. The electronic devices may be interconnected by physical means such as metal traces or wires or, they may be interconnected optically.

Circuit Component/Electronic Circuit Component

A circuit component is an electronic device found in the electronic circuit. The circuit component is also referred to herein as the electronic circuit component.

Model Element

A model element is a numeric and/or algebraic description of a circuit component.

Model/Circuit Model/Electronic Circuit Model

An electronic circuit model of an electronic circuit is a numeric and/or algebraic description of that circuit. It is comprised of all model elements and interconnections that represent the electronic circuit. The electronic circuit model is also referred to herein as the model or the circuit model.

Branch

For purposes of describing the present invention, an electronic circuit is conceptually broken up into a number of branches. A branch is defined to be the lowest level of ideal component, for example, a resistor, an inductor, or a capacitor. A real inductor having lead resistance is modeled as two branches in series, an ideal inductor and an ideal resistor. Two resistors in parallel are two branches. Active components may also be modeled by one or more branches.

Node

An end of a branch.

Accessible Node

A node of the circuit that can be accessed through contact or non-contact methods for testing purposes.

Reference Node

An arbitrarily chosen node of the electronic circuit. Electrical test measurements are made with respect to this node. The reference node may change between test measurements.

Electrical Test Stimulus

A voltage or current applied to the circuit. Test stimuli may be restricted to ranges such that active devices are not turned on. Each ideal electrical test stimulus is typically modeled as a branch separate from other devices on the board. In a representative embodiment, the stimuli for a circuit are modeled exclusively in terms of equivalent current sources. However, in this representative embodiment the test stimuli are provided by voltage sources which for modeling purposes are converted from Thevenin equivalent voltage sources to Norton equivalent current sources. A Thevenin equivalent voltage source models a source of electrical energy with a voltage source and a series impedance, whereas a Norton current source models a source of electrical energy with a current source and a parallel impedance. Standard techniques exist for conversion from one model to the other. Each equivalent electrical test stimulus is then modeled by two branches, one for the ideal source and one for the equivalent output impedance of the source.

Electrical Test Response

A voltage or current measured on the circuit in response to the application of an electrical test stimulus. In representative embodiments, the electrical test responses could be measured as either currents or voltages. However, in the representative embodiment the electrical test responses are voltages measured at the measurement nodes with respect to the reference node.

Parasitic Devices

Some circuit components may be required to accurately construct a circuit model but may not appear on the schematic of the circuit under test. Such devices, for example a termination resistor on a transmission line or a capacitor representing the capacitance of a p-n junction, may be introduced into the circuit model. Also, when the electrical test stimulus is restricted to voltages sufficiently small to consider semiconductor devices open, parasitic devices may have an effect on circuit operation and may need to be included in the model. In general, devices that are required to accurately construct a circuit model, but do not appear on the describing schematic are called parasitic devices.

Node Voltage

The voltage measured at a given node of the electronic circuit with respect to the reference node.

Measurement Node

A node of the electronic circuit at which an electrical test measurement is made. The other terminal of the electrical measuring device is attached to the reference node.

Stimulus Node

A node of the electronic circuit to which an electrical test stimulus is applied. The other terminal of the source of electrical test stimulus is, in a representative embodiment, applied to the reference node. A stimulus node can also be, and typically is, a measurement node.

Short Circuit

A short circuit occurs when one node is electrically connected to another node of the electronic circuit with resultant zero or negligible connecting impedance.

Limited Access

Limited access is the situation that occurs in an electronic circuit when some, but not all, nodes are accessible for the application of electrical test stimulus and the measurement of electrical test response.

Cluster

For test and analysis, the circuit may be divided into one or more clusters. A cluster is defined as an interconnected group of components connected to the remainder of the circuit by either 0 or 1 node. Since a cluster has at most one node in common with the remainder of the circuit, it is effectively isolated from the rest of the board.

Sub-Cluster

A division of a cluster formed for the convenience of test and analysis by using temporary short circuits. Similar to a cluster, a sub-cluster is an interconnected group of components within a cluster which is connected to the remainder of the circuit by either 0 or 1 node. Since a sub-cluster has at most one node in common with the remainder of the circuit, it is effectively isolated from the rest of the board.

3. The Electronic Circuit

FIG. 1 is a drawing of an electronic circuit 105 on a printed circuit board 100 consistent with an embodiment of the present invention. The electronic circuit 105 contains circuit components 110, also referred to herein as electronic circuit components 110, which are electrically interconnected via appropriately placed interconnections 115. The interconnections 115 are made from highly conductive material or materials. The interconnections 115 between circuit components 110 are also referred to herein as nodes 120. While FIG. 1 shows nodes 120 as being only at restricted locations on the interconnections 115, they can be equivalently located anywhere on the interconnections 115 or thought of as being the whole interconnection 115. Due to the complexity and layout of modem printed circuit boards 100, only a subset of the nodes 120 which will be referred to as accessible nodes 125 can be used for test purposes. The other nodes 120 are designated as inaccessible nodes 127. Whenever one of the accessible nodes 125 is used for the application of stimulus, it is referred to as a stimulus node 130. Whenever one of the accessible nodes 125 is used to measure response to applied stimulus, it is referred to as a measurement node 135. In a representative embodiment, stimulus will be applied, one accessible node 125 at a time, to each accessible node 125. For each application of stimulus, measurement of response is made at each of the remaining accessible nodes 125. It is possible in some cases to determine the values and types of the components in the electronic circuit 105 without making measurements of responses at all remaining accessible nodes 125. However, not making measurements at all the remaining accessible nodes 125 results in reduced information and may result in complications in determining values for all the components on the electronic circuit 105. Identification of node 120 as accessible node 125, stimulus node 130, or measurement node 135 in FIG. 1 is for illustrative purposes only.

Other embodiments include application of stimulus at more than one accessible node 125 at a time. The mathematical computations involved in determining the values and types of the components in the electronic circuit 105 are similar to that for the single application. Since in the representative embodiment, equations used in describing the electronic circuit 125 are linear, solutions of test cases involving the simultaneous application of more than one stimulus are superpositions of the application of appropriate single stimulus.

4. Handling Large Clusters

Test voltages are typically small enough that active devices such as transistors and integrated circuits will not be activated. As such, active devices can be modeled either in terms of their parasitic affects upon the electronic circuit 105 or simply as open circuits. These effective open circuits often divide the electronic circuit 105 up into clusters which can be tested and analyzed separately. A cluster is defined to have at most one node in common with any other part of the electronic circuit 105, and therefore, is effectively isolated from the rest of the printed circuit board 100. In some cases, it is advantageous to further divide a complex cluster into smaller sub-clusters by the judicious use of temporary short circuits and then to perform model verification on each sub-cluster individually.

While it is not necessary for the board to be divided into clusters and sub-clusters, equations describing clusters and sub-clusters typically contain fewer unknowns than the full electronic circuit 105 and typically require significantly less time to solve.

In a representative embodiment, test voltages applied to the electronic circuit may have any value which does not damage the circuit. In another representative embodiment, electrical test voltages are small enough such that active devices on the electronic circuit are not turned on. For modern integrated circuits fabricated in silicon, such test voltages should be less than approximately the 0.7 volts forward bias voltage of a P-N junction, but more preferably less than or equal to 0.2 volts. Circuits having active devices fabricated from other materials or based on different technologies, as for example gallium arsenide devices and vacuum tubes, may have either lesser or greater turn-on voltages and, therefore, lesser or greater allowed maximum test voltages. In another embodiment, test voltages may be direct current (DC) signals rather than AC.

Figure 2:
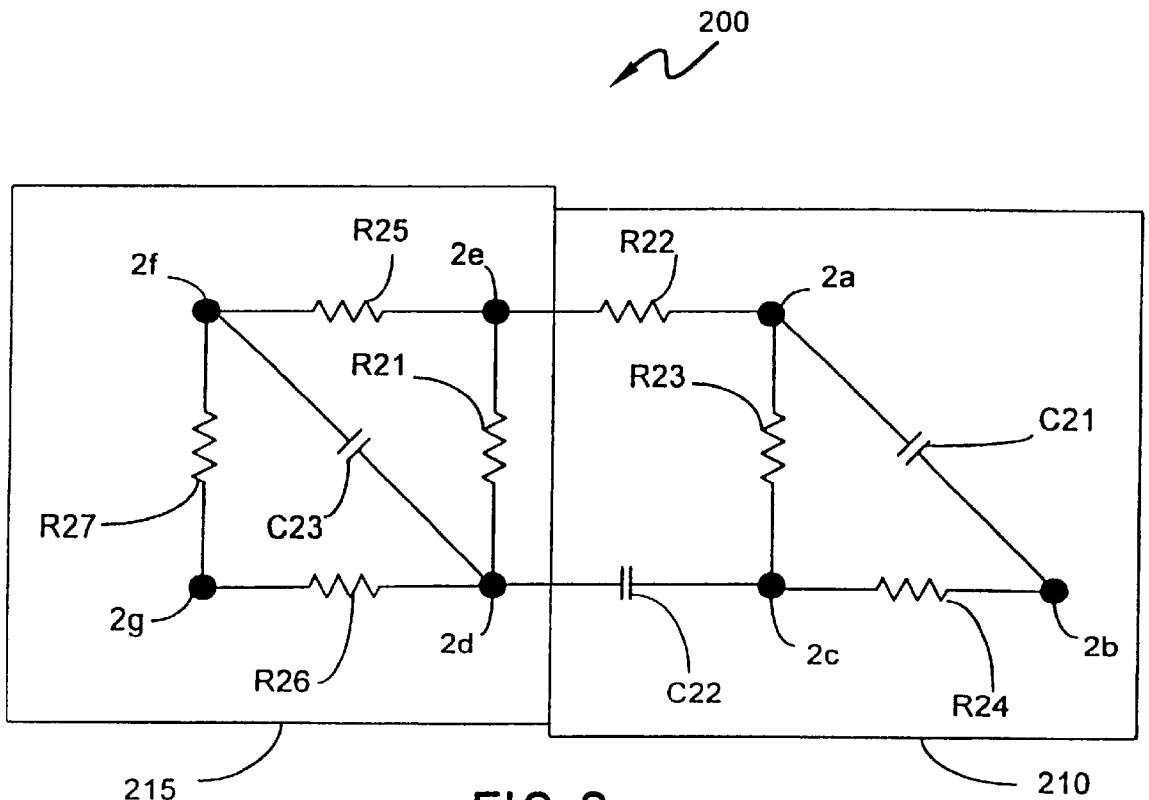
FIG. 2 is a schematic of a cluster of an electronic circuit consistent with an embodiment of the present invention.

FIG. 2 is a schematic of a cluster of an electronic circuit 105 consistent with an embodiment of the present invention. A representative electronic circuit 105 is shown in FIG. 1. FIG. 2 is a drawing of a cluster 200 of an electronic circuit 105 which we shall suppose is representative of a large cluster 200. While FIG. 2 does not, in fact, contain a large number of circuit components 110 shown representatively in FIG. 1, it is supposed that it does for illustrative purposes. In large clusters 200, if there are many circuit components 110 along the path between a given circuit component 110 and the stimulus node 130 at which a stimulus is applied, the signal may drop by a great amount before it reaches the given circuit component 110. This signal drop, in turn, may reduce the precision of the measurements at the given circuit component 110 and may result in wrong test results. In order to avoid this situation, a stimulus is considered valid only for a specific set of circuit components 110 which form a targeted section 210. That is to say, a large cluster 200 can be treated as a set of targeted sections 210, also referred to herein as sub-clusters 210, each of which is associated with a specific set of circuit components 110 and specific nodes 120 to be used for stimulus and response measurements.

In FIG. 2 the cluster 200 has been separated into the targeted section 210 and a remainder-cluster 215. The targeted section 210 is processed to determine any incorrectly modeled and/or missing circuit components 110. When only the targeted section 210 of the cluster 200 is being analyzed, the circuit components 110 that do not belong to this targeted section 210 may not need to be included in the analysis since the voltage across them may be too small to be useful. However, these circuit components 110 may still interfere with the overall behavior of the targeted section 210. In order to minimize this interference, these circuit components 110 are shorted to the ground node if possible.

Figure 3:
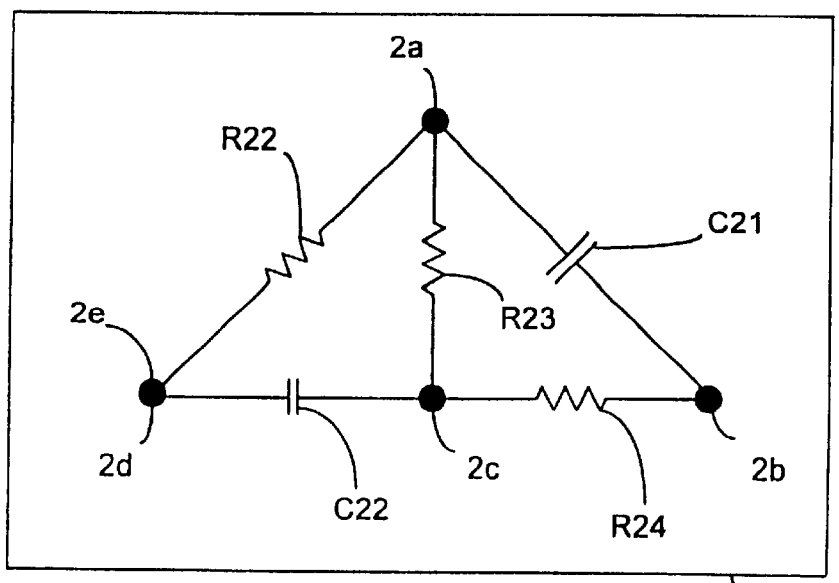
FIG. 3 is a schematic of a part of the electronic circuit of FIG. 2 with two nodes shorted together forming a sub-cluster consistent with an embodiment of the present invention.

As an example in FIG. 2, the targeted section 210 is composed of resistors R22,R23,R24 and capacitors C21, C22, while the remainder-cluster 215 is composed of resistors R21,R25,R26,R27 and capacitor C23. FIG. 3 is a schematic of part of the electronic circuit 105 of FIG. 3 with two nodes 2d, 2e shorted together forming the sub-cluster 210 consistent with an embodiment of the present invention. Note that the sub-cluster 210 has been electrically isolated from the cluster-remainder 215.

By shorting out the circuit components 110 that do not belong to the targeted section 210 being analyzed, we minimize the electrical effect that the rest of the cluster 200 may have on the section. In this fashion, faults are isolated to their respective section since a fault in a section will not affect another section.

5. Board Model Correction System

Figure 4:
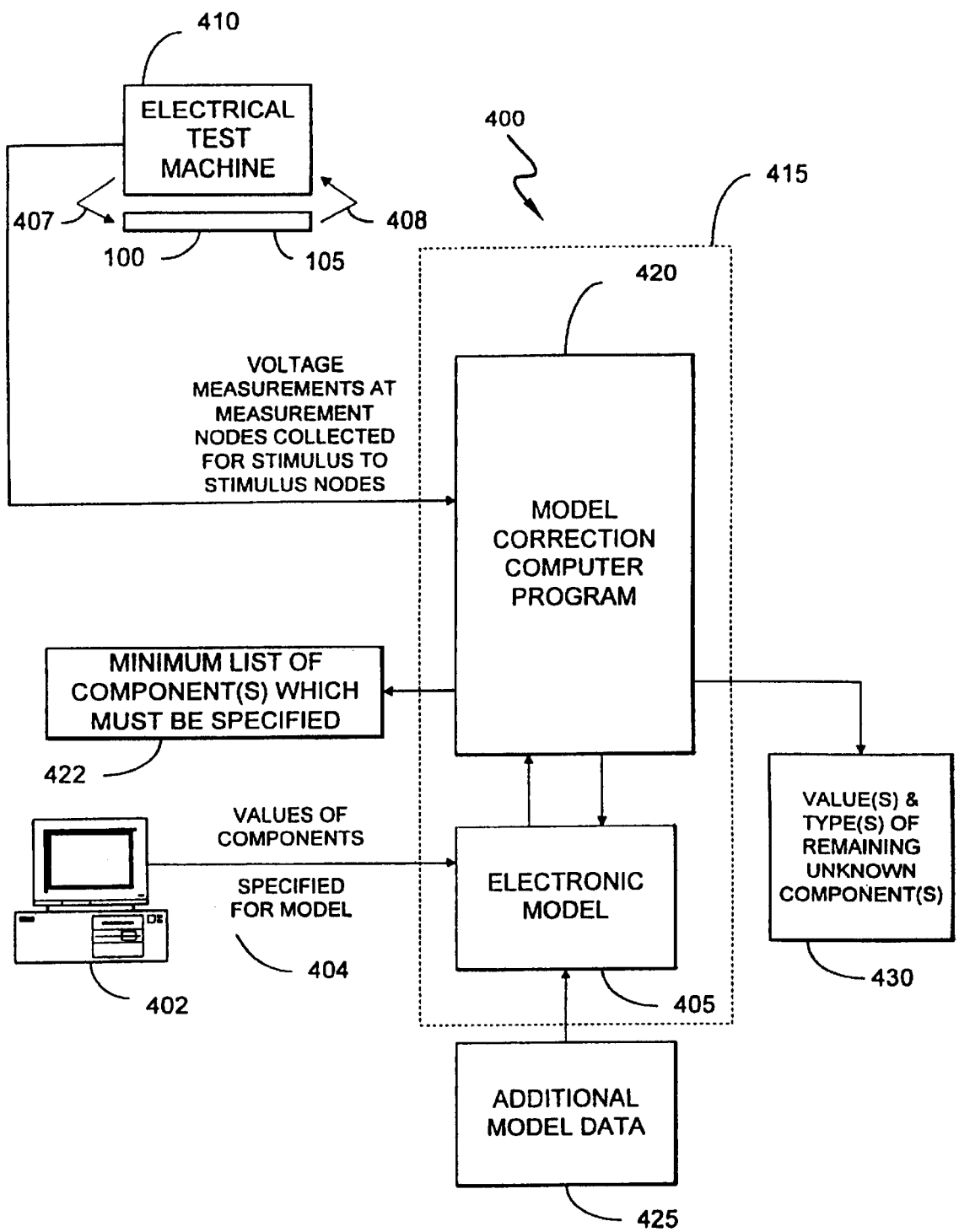
FIG. 4 is a drawing of a model correction system consistent with an embodiment of the present invention.

FIG. 4 is a drawing of a model correction system consistent with an embodiment of the present invention. As shown in FIG. 4, a test system 400 has an electrical test machine 410 which is connected to an electronic circuit 105 on a printed circuit board 100. Electrical test is performed by applying an electrical test stimulus 407 at a stimulus node 130 on the electronic circuit 105, one node 120 at a time and measuring an electrical test response 408 at each of the accessible nodes 125. In practice, each electrical test stimulus 407 will be a voltage but modeled via a Norton equivalent current source for purposes of simplifying the mathematical modeling of the circuit.

Specified values of components 404 for the electronic circuit 105 are available to a model 405, also referred to herein as a circuit model 405 and as an electronic circuit model 405, for the electronic circuit 105 from a model input data source 402 which could be for example a terminal, a computer, or a network computer. The source of the data for the model 405 could be either computer aided design (CAD) data or could also be data entered manually by the operator or others.

A model correction computer program 420, also referred to herein as a computer software program 420, obtains information from the model 405 and from voltage measurements performed on measurement nodes 135 by the electrical test machine 410 when applying electrical test stimulus 407 to the electronic circuit 105. In a representative embodiment, the model correction computer program 420 and the electronic model 405 are stored in a computer system 415.

The model correction computer program 420 then determines a minimum list of component(s) 422 which must be specified, also referred to herein as a minimum list 422, which is the shortest list of components which must be specified as known in order for the model correction computer program 420 to compute the remaining values of the elements of the model 405. The method determines the types and values of the components of the model 405 when a minimum set of other components are specified as known. In the worst case, all components of the model 405 could be modeled incorrectly. In reality all components are unknown.

The operator merely verifies to the model correction computer program 420 that some components are known to be correct. Once this step is completed, the model correction computer program 420 determines the values and types of the remaining (unknown) components 430 based on the values specified for the known components and the voltage measurements. In order to be able to do this, a certain minimum number of known component values and types is required.

Following review by the operator, additional model data 425 is inputted to the electronic model 405. This review and input of additional model data 425 could be automated by, for example, a computer program. Additional model data 425 could exist in tables and accessed by the computer program for input to the electronic model 405. As soon as the operator specifies the value and type of a known component, the program checks if this component is part of the minimum list 422 determined above. If not on the minimum list 422, a new minimum list 422 containing this component is determined and displayed to the operator. Thus, the operator can choose to specify known values and types either for those components on the minimum list 422 or for other components in the model 405 of the electronic circuit 105.

When all the circuit components 110 of the last minimum list 422 are specified as known, the model correction computer program 420 determines the values and types of the remaining circuit components 110. The model correction computer program 420 then highlights as "suspicious" those circuit components 430 whose values have been found to be outside the tolerance range specified in the model 405, or whose type (Resistor, Capacitor, Inductor) is found to be different from that specified in the model 405.

If no suspicious circuit components 110 have been found, the operator may conclude that the model 405 is correct. Otherwise, suggestions are provided by the model correction computer program 420 to help the operator correct a suspicious component. Such suggestions could include adding a device in parallel or in series with the suspicious circuit component 110, changing the type of the circuit components 110, etc.

It should be noted that the operator may specify a circuit component 110 as "known" by specifying it as a short or an open. In this case the actual circuit component 110 on the printed circuit board 100 should be shorted or removed respectively, and the voltage measurements taken again.

6. Model Element Data Structure

FIG. 5 is a drawing of a representative data structure 500 for a model element 510 of the model 405 of the electronic circuit 105 consistent with an embodiment of the present invention. The data structure 500 could be created from computer aided design data or my manual input by the operator. The model element 510 is a numerical description of the corresponding circuit component 110. In this representative embodiment, the model element 510 is composed of a model element identifier 515 which could be for example a number associated with the specific branch in which the circuit component 110 is located; a model element type 520 which could be for example the name of the type of the circuit component 110 i.e., resistor or a predefined number associated with the type of the circuit component 110; a first node connection 525 which could be for example a number assigned to one of the nodes 120 to which the electronic component 110 is attached; a second node connection 530 which could be for example a number assigned to the other node 120 to which the electronic component 110 is attached; a nominal model component value 535; and a model tolerance 540. The model tolerance 540 could be either a single value, which defines the upper and lower tolerance limits of the value of the circuit component 110 via the addition and subtraction of that value from the nominal value for the circuit component 110, or a pair of values one of which specifies the upper tolerance limit and the other the lower tolerance limit of the value of the circuit component 110. The data structure 500 of FIG. 5 is representative only, and other data structures 500 are also possible.

7. Mathematical Derivations & Method for Obtaining Minimum List of Components

This section derives equations used in a representative embodiment and explains the methods used to obtain and solve the equations used in creating the minimum list of electronic components which need to be specified in order to make necessary corrections to the model of an electronic circuit.

7.1. Simplified Tableau Model

An electronic circuit consisting of b branches with n nodes, not including the reference or ground node, can be described by the simplified Tableau model. Using matrix notation this model is developed as follows:

(a) A is the reduced incidence matrix which defines the incidence of current at every node in the circuit with the exception of the reference or ground node. The rows of A represent the n nodes of the circuit, and the columns represent the b branches. If the current in a given branch flows out of a particular node, the element of A for that branch and node is set equal to +1; if the current flows into the node, that element is set equal to −1; and if the current does not flow into or out of the node, the element is set equal to 0. Thus, A is an (n×b) matrix and can be written as, $$A = \begin{bmatrix} a_{11} & a_{12} & \ldots & a_{1b} \\ a_{21} & a_{22} & \ldots & a_{2b} \\ \ldots & \ldots & \ldots & \ldots \\ a_{n1} & a_{n2} & \ldots & a_{nb} \end{bmatrix} \qquad \text{(Eq. 1)}$$

(b) $I_b$ is the matrix of all branch currents in the circuit. $I_b$ is a (b×1) matrix with each element representing the current in its respective branch. $I_b$ can be written as, $$I_b = \begin{bmatrix} i_1 \\ i_2 \\ \ldots \\ i_i \\ \ldots \\ i_b \end{bmatrix} \qquad \text{(Eq. 2)}$$

where $i_i$ is the current flowing in the ith branch.

Kirkoff's law states that all currents at a given node must sum to zero. In matrix format, this law can be written as $$AI_b = 0 \qquad \text{(Eq. 3)}$$

where 0 is the zero matrix which is a matrix having all elements identically equal to 0.

(c) S is the matrix of current and voltage sources. It is a (b×1) matrix with all elements equal to 0 except for those elements corresponding to branches which contain current or voltage sources. S can be written as, $$S = \begin{bmatrix} s_1 \\ s_2 \\ \vdots \\ s_i \\ \vdots \\ s_b \end{bmatrix} \quad \text{(Eq. 4)}$$

where $s_i$ is the current or voltage supplied by the ith branch. Note that only branches containing current or voltage sources will have non-zero values in the S matrix.

(d) $V_b$ is a matrix of the voltages across all branches of the circuit. It is a (b×1) matrix with each element representing the voltage across its respective branch. $V_b$ can be written as, $$V_b = \begin{bmatrix} v_1 \\ v_2 \\ \vdots \\ v_i \\ \vdots \\ v_b \end{bmatrix} \quad \text{(Eq. 5)}$$

where $v_i$ is the voltage across the ith branch.

(e) The following derivation is limited to branches containing either current sources or passive impedances with dependent sources not being permitted. It is noted, however, that branches containing voltage sources can be modeled using Norton equivalent current sources. The currents in the ith branch whose element has not been further specified can be written generally as $$s_i = k^i_{ii} i_i - k^v_{ii} v_i \quad \text{(Eq. 6)}$$

where $k^i_{ii}$ and $k^v_{ii}$ are constants relating the source current $s_i$ to the branch current $i_i$ and the branch voltage $v_i$. If the branch contains only a current source, Equation 6 reduces to $$s_i = k^i_{ii} i_i \quad \text{(Eq. 7)}$$

While if the branch contains only an impedance, Equation 6 becomes $$0 = k^i_{ii} i_i - k^v_{ii} v_i \quad \text{(Eq. 8)}$$

Defining matrices $$K_i = \begin{bmatrix} k^i_{11} & k^i_{12} & \cdots & k^i_{1b} \\ k^i_{21} & k^i_{22} & \cdots & k^i_{2b} \\ \cdots & \cdots & \cdots & \cdots \\ k^i_{b1} & k^i_{b2} & \cdots & k^i_{bb} \end{bmatrix} \quad \text{(Eq. 9)}$$

and $$K_v = \begin{bmatrix} k^v_{11} & k^v_{12} & \cdots & k^v_{1b} \\ k^v_{21} & k^v_{22} & \cdots & k^v_{2b} \\ \cdots & \cdots & \cdots & \cdots \\ k^v_{b1} & k^v_{b2} & \cdots & k^v_{bb} \end{bmatrix} \quad \text{(Eq. 10)}$$

results in the matrix representation $$K_i I_b - K_v V_b = S \quad \text{(Eq. 11)}$$

for all the branches. It will be noted that the $k^i_{ii}$ can be defined for convenience to be one with all off diagonal elements $k^i_{ij}$ being zero.

(f) Combining Equations (3) and (11) results in $$\begin{bmatrix} K_i & -K_v \\ A & 0 \end{bmatrix} \begin{bmatrix} I_b \\ V_b \end{bmatrix} = \begin{bmatrix} S \\ 0 \end{bmatrix} \quad \text{(Eq. 12)}$$

(g) Noting that branch voltages can be transformed into node voltages by $$V_b = A^T V_n \quad \text{(Eq. 13)}$$

where $V_n$ is the matrix of node voltages and $A^T$ is the transpose of A [for proof of Equation 13, see Chua, Leon O., Lin, Pen-Min, *Computer Aided Analysis of Electronic Circuits: Algorithms & Computational Techniques*, Prentice-Hall, Englewood Cliffs, N.J., 1975]. $V_n$ can be written as $$V_n = \begin{bmatrix} v^n_1 \\ v^n_2 \\ \vdots \\ v^n_i \\ \vdots \\ v^n_n \end{bmatrix} \quad \text{(Eq. 14)}$$

where $v^n_i$ is the voltage at the ith node.

(h) Combining Equations (12) and (13), $$\begin{bmatrix} K_i & -K_v A^T \\ A & 0 \end{bmatrix} \begin{bmatrix} I_b \\ V_n \end{bmatrix} = \begin{bmatrix} S \\ 0 \end{bmatrix} \quad \text{(Eq. 15)}$$

Equation 15 is the Simplified Tableau model for a circuit with b branches and n nodes. Observing that $K_i$ and $K_v$ are of order (b×b), A is of order (n×b), and $A^T$ is of order (b×n), results in the composite left matrix of the left side of Equation 15 being of order ([b+n]×[b+n]).

In the following discussion, each branch contains only one ideal element. Any parasitic elements, such as lead resistance in an inductor or active devices, are modeled as additional branches. In general, test stimuli are restricted to ranges such that active devices are not turned on. Test stimuli are modeled as separate branches of the circuit. In a representative embodiment, the stimuli for a circuit are modeled exclusively in terms of current sources. However, in this representative embodiment the test stimuli may also be provided by voltage sources which for modeling purposes are converted from Thevenin equivalent voltage sources to Norton equivalent current sources.

The matrices $K_i$ and $K_v$ describe the impedance and the admittance of the branches respectively. For each branch, only the impedance or the admittance can be included in Equation 8, not both. For a source branch, $K_v$ is zero as indicated by Equation 7. If a branch is described by its impedance $K_i$, the corresponding value of $K_v$ should be set equal to one; and vice versa. For convenience, we choose to describe the branches by their admittances $K_v$.

Thus, all $k^i_{ij}$ are zero except for those diagonal elements $k^i_{ii}$ which are set equal to one. The diagonal elements of $K_v$ then will be the admittances of the various branches, except for those diagonal elements corresponding to source branches. The diagonal elements of the source branches are set equal to zero.

7.2. Solving the Simplified Tableau Equation

Solving Equation 15 for the branch currents and node voltages, $$\begin{bmatrix} I_b \\ V_n \end{bmatrix} = \begin{bmatrix} K_i & -K_v A^T \\ A & 0 \end{bmatrix}^{-1} \begin{bmatrix} S \\ 0 \end{bmatrix} \quad \text{(Eq. 16)}$$

The inverse matrix in Equation 16 can be partitioned into four matrices, N, P, Q, and Z, one each in the four quadrants of that inverse matrix, as follows:

$$\begin{bmatrix} K_i & -K_v A^T \\ A & 0 \end{bmatrix}^{-1} = \begin{bmatrix} N & P \\ Z & Q \end{bmatrix} \quad \text{(Eq. 17)}$$

From Equations 16 and 17, the node voltages have the following simple relationship in terms of applied sources and the (n×b) sub-matrix Z:

$$V_n = ZS \quad \text{(Eq. 18)}$$

Since the inverse matrix of Equation 17 is of order ([b+n]×[b+n]) and Z is of order (n×b), it follows that N is of order (b×b), P is of order (b×n), and Q is of order (n×n).

7.3. Component Value Matrix

Letting the elements of the sub-matrix Z in Equation 18 be designated by $z_{ij}$, the voltage elements $v^n_i$ of the vector $V_n$ can be expressed as $$V_n = \begin{bmatrix} v^n_1 \\ v^n_2 \\ \vdots \\ v^n_n \end{bmatrix} = \begin{bmatrix} z_{11} & z_{12} & \cdots & z_{1b} \\ z_{21} & z_{22} & \cdots & z_{2b} \\ \cdots & \cdots & \cdots & \cdots \\ z_{n1} & z_{n2} & \cdots & z_{nb} \end{bmatrix} \begin{bmatrix} s_1 \\ s_2 \\ \vdots \\ s_b \end{bmatrix} \Rightarrow v^n_i = \sum_{j=1}^{b} z_{ij} s_j \quad \text{(Eq. 19)}$$

Assuming m accessible nodes which does not count the reference or ground node, for a given stimulus there can be up to m voltage measurements, one at each of the accessible nodes. Since measurements corresponding to multiple stimuli applied simultaneously are a linear combination of those corresponding to the stimuli applied individually, stimulus is usually applied to only one branch at a time for stimulus branches between a given node and the reference node. So at any given application of stimulus and associated measurements, all components $s_j$ of the stimulus vector S are 0 except for one. Let $v_{ij}$ designate the voltage measurement at node i when stimulus is applied between node j and the reference node. Then, Equation 19 can be modified to describe all the possible measurements as follows:

$$\begin{bmatrix} v_{11} & v_{12} & \cdots & v_{1m} \\ v_{21} & v_{22} & \cdots & v_{2m} \\ \cdots & \cdots & \cdots & \cdots \\ v_{m1} & v_{m2} & \cdots & v_{mm} \end{bmatrix} = \quad \text{(Eq. 20)}$$

$$\begin{bmatrix} z_{11} & z_{12} & \cdots & z_{1b} \\ z_{21} & z_{22} & \cdots & z_{2b} \\ \cdots & \cdots & \cdots & \cdots \\ z_{m1} & z_{m2} & \cdots & z_{mb} \end{bmatrix} \begin{bmatrix} s_{11} & 0 & \cdots & \cdots \\ 0 & s_{22} & 0 & \cdots \\ \cdots & \cdots & \cdots & \cdots \\ 0 & \cdots & 0 & s_{mm} \\ 0 & \cdots & \cdots & \cdots \\ \cdots & \cdots & \cdots & \cdots \\ 0 & \cdots & \cdots & \cdots \end{bmatrix}$$

where $v_{ij}$ is the voltage measured at node i due to the application of a source $s_{jj}$ at node j, i.e., the branch corresponding to the stimulus between the node j and the reference node. A given application of a single stimulus corresponds to a column of the S matrix in Equation 20, with measurement of the voltages in the corresponding column of the V matrix.

The following (m×m) portion of the Z matrix of Equation 20 can be determined empirically by using measured voltages $v_{ij}$ and known applied sources $s_{jj}$.

$$Z_m = \begin{bmatrix} \tilde{z}_{11} = \frac{v_{11}}{s_{11}} & \tilde{z}_{12} = \frac{v_{12}}{s_{22}} & \cdots & \tilde{z}_{1m} = \frac{v_{1m}}{s_{mm}} \\ \tilde{z}_{21} = \frac{v_{21}}{s_{11}} & \tilde{z}_{22} = \frac{v_{22}}{s_{22}} & \cdots & \tilde{z}_{2m} = \frac{v_{2m}}{s_{mm}} \\ \cdots & \cdots & \cdots & \cdots \\ \tilde{z}_{m1} = \frac{v_{m1}}{s_{11}} & \tilde{z}_{m2} = \frac{v_{m2}}{s_{22}} & \cdots & \tilde{z}_{mm} = \frac{v_{mm}}{s_{mm}} \end{bmatrix} \quad \text{(Eq. 21)}$$

wherein the superscript "~" on each matrix element indicates that it was determined empirically.

7.4. Problem Formulation

In the following, a method is derived to use the elements of the reduced matrix $Z_m$ above along with information on known components to obtain the types and values of the unknown components of the circuit. Multiplying Equation 17 by the inverse of the left hand side results in the following:

$$\begin{bmatrix} K_i & -K_v A^T \\ A & 0 \end{bmatrix} \begin{bmatrix} N & P \\ Z & Q \end{bmatrix} = \begin{bmatrix} 1 & 0 & \cdots & 0 & 0 \\ 0 & 1 & 0 & \cdots & 0 \\ \cdots & \cdots & \cdots & \cdots & \cdots \\ 0 & \cdots & 0 & 1 & 0 \\ 0 & 0 & \cdots & 0 & 1 \end{bmatrix} = 1_{(b+n) \times (b+n)} \quad \text{(Eq. 22)}$$

where $1_{(b+n) \times (b+n)}$ is the ([b+n]×[b+n]) identity matrix.

Recalling that N is a (b×b) sub-matrix located in the upper left hand corner of the NPQZ matrix of Equation 22, and that Z is an (n×b) sub-matrix located in the lower left hand corner of the NPQZ matrix, those elements can be extracted from Equation 22 resulting in $$\begin{bmatrix} K_i & -K_v A^T \\ A & 0 \end{bmatrix} \begin{bmatrix} N \\ Z \end{bmatrix} = \begin{bmatrix} 1 & 0 & \cdots & 0 & 0 \\ 0 & 1 & 0 & \cdots & 0 \\ \cdots & \cdots & \cdots & \cdots & \cdots \\ 0 & \cdots & 0 & 1 & 0 \\ 0 & 0 & \cdots & 0 & 1 \\ 0 & 0 & \cdots & 0 & 0 \\ 0 & 0 & \cdots & 0 & 0 \\ \cdots & \cdots & \cdots & \cdots & \cdots \\ 0 & 0 & \cdots & 0 & 0 \\ 0 & 0 & \cdots & 0 & 0 \end{bmatrix} = \begin{bmatrix} 1_{b \times b} \\ 0_{n \times b} \end{bmatrix} \quad \text{(Eq. 23)}$$

where $1_{b \times b}$ is the (b×b) identity matrix and $0_{n \times b}$ is the (n×b) matrix of 0's.

The matrix product $-K_v A^T$ in the left-hand side of Equation 23 can be moved to the unknown portion as follows:

$$\begin{bmatrix} K_i & -K_v A^T \\ A & 0 \end{bmatrix} \begin{bmatrix} N \\ Z \end{bmatrix} = \begin{bmatrix} 1_{b \times b} \\ 0_{n \times b} \end{bmatrix} \Rightarrow \quad \text{(Eq. 24)}$$

$$\begin{bmatrix} K_i & 1_{b \times b} \\ A^T A & 0_{b \times b} \end{bmatrix} \begin{bmatrix} N \\ -K_v A^T Z \end{bmatrix}$$

$$= \begin{bmatrix} 1_{b \times b} \\ 0_{b \times b} \end{bmatrix}$$

where as previously indicated $K_i$ is a (b×b) matrix, $K_v$ is a (b×b) matrix, $A^T$ is a (b×n) matrix, A is an (n×b) matrix, and Z is an (n×b) matrix.

Letting $$M = \begin{bmatrix} K_i & 1_{b \times b} \\ A^T A & 0_{b \times b} \end{bmatrix}, B = \begin{bmatrix} 1_{b \times b} \\ 0_{b \times b} \end{bmatrix} \quad \text{(Eq. 25)}$$

and $$Y = \begin{bmatrix} N \\ -K_v A^T Z \end{bmatrix} \quad \text{(Eq. 26)}$$

Equation 24 can be restated more simply as $$MY = B \quad \text{(Eq. 27)}$$

where M is a (2b×2b) matrix, B is a (2b×b) matrix, and Y is a (2b×b) matrix. The incidence matrix A is set to the incidence matrix of the given board model and will be assumed known. The objective is to solve Equation 24 for $K_v$ which describes the parameters of the components on the circuit board.

When n<b, the matrix M is rank deficient. This situation means that Equation 27 has an infinite number of solutions. More details will be provided in the following, wherein we describe how to find a unique solution by using the information available from measurements performed and known components of the board. In Equation 27, the (2b×2b) matrix M and the (2b×b) matrix B are known, and the (2b×b) matrix Y is unknown.

7.5. The Method

In the following, a 4-step method is described which obtains values for the unknown components of the circuit board. Briefly, the first step of the method consists of empirically determining the elements of $Z_m$ by using Equation 21. Then, matrix M of Equation 27 is decomposed in the second step by using the Singular Value Decomposition (SVD) algorithm [see, for example, G. E. Forsythe, M. A. Malcolm, C. B. Moler, *Computer Methods for Mathematical Computations*, Prentice-Hall, Englewood Cliffs, N.J., 1977], and the non-uniqueness of the solution of Equation 27 is highlighted. Finally, in the last two steps of the method, information from the first step, together with information about known components of the board are combined to determine a unique solution for the problem.

Step 1:

Empirically determine the elements of $Z_m$. [see Equation 21]

Step 2:

Using the SVD algorithm and defining $$M = L \Sigma R^* \quad \text{(Eq. 28)}$$

where the superscript "*" indicates the conjugate transpose of a matrix. It follows that Equation 27 becomes $$MY = B \Leftrightarrow L \Sigma R^* Y = B \rightarrow \Sigma R^* Y = L^* B \quad \text{(Eq. 29)}$$

where it is noted that L and R are (2b×2b) matrices, and advantage has been taken of the fact that they have the following property:

$$L^* L = LL^* = R^* R = RR^* = \text{Identity Matrix} \quad \text{(Eq. 30)}$$

Letting $$W = R^* Y \quad \text{(Eq. 31)}$$

and $$D = L^* B \quad \text{(Eq. 32)}$$

Equation 29 can be rewritten as:

$$\Sigma W = D \quad \text{(Eq. 33)}$$

It follows from the SVD algorithm that the matrix $\Sigma$ is a (2b×2b) diagonal matrix where the bottom k diagonal elements are 0 if its rank deficiency is k. That is, by expanding Equation 33:

$$\begin{bmatrix} \sigma_{11} & 0 & \cdots & \cdots & \cdots & \cdots & 0 \\ 0 & \sigma_{22} & 0 & \cdots & \cdots & \cdots & \cdots \\ \cdots & \cdots & \cdots & \cdots & \cdots & \cdots & \cdots \\ 0 & \cdots & 0 & \sigma_{(2b-k)(2b-k)} & 0 & \cdots & 0 \\ 0 & \cdots & \cdots & \cdots & 0 & \cdots & 0 \\ \cdots & \cdots & \cdots & \cdots & \cdots & \cdots & \cdots \\ 0 & \cdots & \cdots & \cdots & \cdots & \cdots & 0 \end{bmatrix} W = D \quad \Big\} \; k \text{ rows} \quad \text{(Eq. 34)}$$

where the $\sigma_{ij}$ are the elements of the matrix $\Sigma$. k is of the order of the total number of branches of the circuit less the number of nodes. It is the maximum of the number of rows or columns in the matrix M that can be obtained as a linear combination of the others.

Letting $w_{ij}$ designate the elements of W, $d_{ij}$ designate the elements of D, 15 and expanding Equation 34 the following is obtained:

$$\begin{bmatrix} \sigma_{11} w_{11} & \sigma_{11} w_{12} & \cdots & \sigma_{11} w_{1b} \\ \sigma_{22} w_{21} & \sigma_{22} w_{22} & \cdots & \sigma_{22} w_{2b} \\ \cdots & \cdots & \cdots & \cdots \\ \sigma_{(2b-k)(2b-k)} w_{(2b-k)1} & \sigma_{(2b-k)(2b-k)} w_{(2b-k)2} & \cdots & \sigma_{(2b-k)(2b-k)} w_{(2b-k)b} \\ 0 = 0 \times w_{(2b-k+1)1} & 0 = 0 \times w_{(2b-k+1)2} & \cdots & 0 = 0 \times w_{(2b-k+1)b} \\ \cdots & \cdots & \cdots & \cdots \\ 0 = 0 \times w_{(2b)1} & 0 = 0 \times w_{(2b)2} & \cdots & 0 = 0 \times w_{(2b)b} \end{bmatrix} = \quad \text{(Eq. 35)}$$

$$\begin{bmatrix} d_{11} & d_{12} & \ldots & d_{1b} \\ d_{21} & d_{22} & \ldots & d_{2b} \\ \ldots & \ldots & \ldots & \ldots \\ d_{(2b-k)1} & d_{(2b-k)2} & \ldots & d_{(2b-k)b} \\ 0 & 0 & \ldots & 0 \\ \ldots & \ldots & \ldots & \ldots \\ 0 & 0 & \ldots & 0 \end{bmatrix}$$

In Equation 35 each element of row i of W has been multiplied by the ith diagonal element of $\Sigma$ to result in the corresponding element of the ith row of D. The elements of the last k rows of W are always multiplied by 0 resulting in the last k rows of D being null. Hence, the last k rows of W can have any values and still result in a valid solution for the system of equations. (If, and only if, the set of equations are inconsistent, the last k rows of D may not all be null.)

By inspecting Equation 35, it can be seen that a solution W can be found such that elements of the first (2b–k) rows are elements of the first (2b–k) rows of D divided by the non-zero diagonal element in the corresponding rows of $\Sigma$, and such that the last k rows are arbitrary. Let the defined elements of W be represented by $w_{ij}$ and the arbitrary elements of the last k rows by $x_{ij}$ where the values of the $x_{ij}$ are arbitrary or unknown. That is, W has the following form:

$$W = \begin{bmatrix} w_{11} = \frac{d_{11}}{\sigma_{11}} & w_{12} = \frac{d_{12}}{\sigma_{11}} & \ldots & w_{1b} = \frac{d_{1b}}{\sigma_{11}} \\ w_{21} = \frac{d_{21}}{\sigma_{22}} & w_{22} = \frac{d_{22}}{\sigma_{22}} & \ldots & w_{2b} = \frac{d_{2b}}{\sigma_{22}} \\ \ldots & \ldots & \ldots & \ldots \\ w_{(2b-k)1} = \frac{d_{(2b-k)1}}{\sigma_{(2b-k)(2b-k)}} & w_{(2b-k)2} = \frac{d_{(2b-k)2}}{\sigma_{(2b-k)(2b-k)}} & \ldots & w_{(2b-k)b} = \frac{d_{(2b-k)b}}{\sigma_{(2b-k)(2b-k)}} \\ x_{11} = ? & x_{12} = ? & \ldots & x_{1b} = ? \\ \ldots & \ldots & \ldots & \ldots \\ x_{k1} = ? & x_{k2} = ? & \ldots & x_{kb} = ? \end{bmatrix}$$

Step 3:

Select only the first m columns of W, where m is the number of measurements made in Step 1. Then by using Equations 26 and 31:

$$Y|_m = RW|_m = \begin{bmatrix} N \\ -K_v A^T Z \end{bmatrix}_m \quad \text{(Eq. 37)}$$

where $|_m$ designates taking the first m columns of the associated matrix. By expanding the above equation and considering only the last b rows of R, it can be seen that:

$$[R_b] \begin{bmatrix} w_{11} & w_{12} & \ldots & w_{1m} \\ w_{21} & w_{22} & \ldots & w_{2m} \\ \ldots & \ldots & \ldots & \ldots \\ w_{(2b-k)1} & w_{(2b-k)2} & \ldots & w_{(2b-k)m} \\ x_{11} & x_{12} & \ldots & x_{1m} \\ \ldots & \ldots & \ldots & \ldots \\ x_{k1} & x_{k2} & \ldots & x_{km} \end{bmatrix} = \quad \text{(Eq. 38)}$$

$$-\begin{bmatrix} k_{11}^v & 0 & \ldots & 0 \\ 0 & k_{22}^v & 0 & \ldots \\ \ldots & \ldots & \ldots & \ldots \\ 0 & \ldots & 0 & k_{bb}^v \end{bmatrix} [A]^T \begin{bmatrix} \tilde{z}_{11} & \tilde{z}_{12} & \ldots & \tilde{z}_{1m} \\ \tilde{z}_{21} & \tilde{z}_{22} & \ldots & \tilde{z}_{2m} \\ \ldots & \ldots & \ldots & \ldots \\ \tilde{z}_{m1} & \tilde{z}_{m2} & \ldots & \tilde{z}_{mm} \\ z_{(m+1)1} & z_{(m+1)2} & \ldots & z_{(m+1)m} \\ \ldots & \ldots & \ldots & \ldots \\ z_{n1} & z_{n2} & \ldots & z_{nm} \end{bmatrix}$$

where the matrix $R_b$ is the (b×2b) matrix consisting of the last b rows of R.

In the above system of equations, there are at least m known $kv_{ij}$ which correspond to the source branches and $m^2$ known $z_{ij}$ obtained from the m measurements of Step 1.

Other $k^v_{ij}$ elements corresponding to values of components on the circuit board can be determined through in-circuit testing or by other means. The unknown elements are the variables $x_{ij}$, the remaining variables $k^v_{ij}$, and the remaining variables $z_{ij}$.

The objective in this third step of the method is to determine all the variables $x_{ij}$ and possibly some of the variables $z_{ij}$ (those for i>m or j>m) by using equations that contain only the known elements of the matrix $K_v$. For a given known element of $K_v$, say the ith row and ith column where i varies from 1 to b, a set of linear equations is obtained from Equation 38 as follows:

$r_{(i+b)1}w_{1l} + r_{(i+b)2}w_{2l} + \ldots + r_{(i+b)(2b-k)}w_{(2b-k)l} + r_{(i+b)(2b-k+1)}x_{1l} + \ldots r_{(i+b)(2b)}x_{kl} =$ $-[k_{ii}^v a_{1i} z_{1l} + k_{ii}^v a_{2i} z_{2l} + \ldots k_{ii}^v a_{mi} z_{ml} + k_{ii}^v a_{(m+1)i} + \ldots + k_{ii}^v a_{ni} z_{nl}]$ (Eq. 39)

where $a_{ij}$ and $r_{ij}$ are the elements of the matrices A and R respectively and where Equation 39 has been written for the lth column (l=1,2, . . . ,m) of the resultant matrices of each side of Equation 38 which corresponds to the lth column of both the $W|_m$ and the $Z|_m$ matrices.

Equation 39 represents a total of m separate equations (l=1,2, . . . ,m) for each of the m known $k^v_{jj}$. There are thus $m^2$ equations of the form of Equation 39 where the $k^v_{jj}$ are known constants. The unknown elements in these equations are the variables $x_{il}$ and some of the variables $z_{ij}$. Since there are k unknowns $x_{il}$ in the Ith column of $W|_m$, at least k equations of the above type are needed for each column. Some of these equations may contain the unknowns $z_{il}$ in which case additional equations are required. This third step of the method sets up all the linear equations associated with the known components of $K_y$ and counts the total number of unknown variables in these equations which includes the unknowns $x_{ij}$ and $z_{ij}$. If the number of equations is equal or greater than the number of unknowns, then a unique solution can be obtained for the unknowns. Otherwise, the operator is prompted to specify additional known components of the $K_y$ matrix or guess some values for some components.

From Equation 38, the number of unknown $x_{ij}$ is at most k multiplied by m, and the number of unknown $z_{ij}$ is at most (n−m) multiplied by m.

Step 4:

Once all variables $x_{ij}$ are determined, Equation 38 can be used again to find the remaining unknown elements in the matrices Z and $K_y$. Expanding Equation 39 for a row i in $R_b$ where 2b>=i>b and a column I of $W|_m$ (i.e., 1<=l<=m) results in the following:

$$\sum_{j=1}^{2b} r_{ij} w_{jl} = -k^v_{(i-b)(i-b)} \left\{ \sum_{j=1}^{p} a^t_{(i-b)j} \tilde{z}_{jl} + \sum_{j=p+1}^{n} a^t_{(i-b)j} z_{jl} \right\} \quad \text{(Eq. 40)}$$

where $a^t_{ij}$ are the elements of the matrix $A^T$. Here, the unknowns $x_{ij}$ are represented by elements $w_{ij}$ of the matrix W. Assuming that the first p rows of Equation 38 were used in Step 3, the index i can take any row number from (p+1) to 2b while I can vary from 1 to m. In Equation 40, $z_{ij}$ in the sum j from 1 to p are known quantities, while $z_{ij}$ in the sum j from (p+1) to n are unknown quantities. $K_y$ is also unknown.

Equation 40 can be rearranged to put the unknown elements on the left side and the known elements on the right side as follows:

$$\sum_{j=1}^{2b} \frac{r_{ij} w_{jl}}{k^v_{(i-b)(i-b)}} + \sum_{j=p+1}^{n} a^t_{(i-b)j} z_{jl} = -\sum_{j=1}^{p} a^t_{(i-b)j} \tilde{z}_{jl} \quad \text{(Eq. 41)}$$

Equation 41 can be expanded into matrix format as follows:

$$\text{(Eq. 42)}$$

$$\begin{bmatrix} \sum_{j=1}^{2b} r_{(p+1)j} w_{j1} & 0 & \cdots & 0 & a^t_{(p-b+1)(m+1)} & a^t_{(p-b+1)(m+2)} & \cdots & a^t_{(p-b+1)n} & 0 & \cdots & 0 & 0 \cdots \\ 0 & \sum_{j=1}^{2b} r_{(p+2)j} w_{j1} & 0 & \cdots & a^t_{(p-b+2)(m+1)} & a^t_{(p-b+2)(m+2)} & \cdots & a^t_{(p-b+2)n} & 0 & \cdots & 0 & 0 \cdots \\ \cdots & \cdots & \cdots & 0 & \cdots & \cdots & \cdots & \cdots & \cdots & \cdots & \cdots & \cdots \\ 0 & \cdots & 0 & \sum_{j=1}^{2b} r_{(2b)j} w_{j1} & a^t_{b(p+1)} & a^t_{b(p+2)} & \cdots & a^t_{bn} & 0 & \cdots & 0 & 0 \cdots \\ \sum_{j=1}^{2b} r_{(p+1)j} w_{j2} & 0 & \cdots & 0 & 0 & \cdots & \cdots & 0 & a^t_{(p-b+1)(m+1)} & \cdots & a^t_{(p-b+1)n} & 0 \cdots \\ 0 & \sum_{j=1}^{2b} r_{(p+2)j} w_{j2} & 0 & \cdots & 0 & \cdots & \cdots & 0 & a^t_{(p-b+2)(m+1)} & \cdots & a^t_{(p-b+2)n} & 0 \cdots \\ \cdots & \cdots & \cdots & 0 & \cdots & \cdots & \cdots & 0 & \cdots & \cdots & \cdots & \cdots \\ 0 & \cdots & 0 & \sum_{j=1}^{2b} r_{(2b)j} w_{j2} & 0 & \cdots & \cdots & 0 & a^t_{b(m+1)} & \cdots & a^t_{bn} & 0 \cdots \\ \cdots & \cdots & \cdots & \cdots & \cdots & \cdots & \cdots & \cdots & \cdots & \cdots & \cdots & \cdots \end{bmatrix} \begin{bmatrix} \frac{1}{k^v_{(p-b+1)(p-b+1)}} \\ \frac{1}{k^v_{(p-b+2)(p-b+2)}} \\ \cdots \\ \frac{1}{k^v_{bb}} \\ z_{(m+1)1} \\ z_{(m+2)1} \\ \cdots \\ z_{n1} \\ z_{(m+1)2} \\ z_{(m+2)2} \\ \cdots \\ z_{n2} \\ \cdots \\ z_{nm} \end{bmatrix} = RHS$$

where the right-hand side of Equation 42 is as follows:

$$RHS = \begin{bmatrix} -\sum_{j=1}^{p} a^t_{(p-b+1)j} \tilde{z}_{j1} \\ -\sum_{j=1}^{p} a^t_{(p-b+2)j} \tilde{z}_{j1} \\ \cdots \\ -\sum_{j=1}^{p} a^t_{bj} \tilde{z}_{j1} \\ -\sum_{j=1}^{p} a^t_{(p-b+1)j} \tilde{z}_{j2} \\ -\sum_{j=1}^{p} a^t_{(p-b+2)j} \tilde{z}_{j2} \\ \cdots \\ -\sum_{j=1}^{p} a^t_{bj} \tilde{z}_{j2} \\ \cdots \end{bmatrix} \quad \text{(Eq. 43)}$$

The solution of the above system of equations yields the unknown elements of the $K_y$ matrix as well as some of the unknowns of the Z matrix. When the known $K_y$ is used in Equation 17, the full Z matrix is readily obtained.

After completion of Step 4, all unknown elements of the $K_y$ matrix are determined which means that all component values have been determined. Repeating the calculations for two separate frequencies will permit determination of the types of the components, as is explained in Section 9 below.

A comparison of the calculated values and types to those in the model identifies a set of components whose calculated values and/or types do not match the model.

The operator reviews these results and, after making certain changes to the model, repeats the above process. These changes may include specifying additional components as known, specifying some as unknown, adding parasitic devices to the model based on the calculated values for components, and changing component tolerance or nominal values. Information for specifying the additional components may be obtained from additional inspections, additional measurements, making guesses based on experience and/or measurements, or by other means.

The above process can be implemented by various means, such as in a computer software program, in firmware or in hardware devices. In a representative embodiment, the above process is implemented by means of a computer software program. This program is written so as to provide hints and suggestions to the operator for possible changes to component values. In particular, the software program determines a complex number for the elements of $K_v$, the complex number describing a component with a resistive part (described by the real part of the complex number) as well as an inductive or capacitive part (described by the imaginary part of the complex number). Then the computer displays these two parts to the operator, and provides the operator the opportunity to change the device specification or to add a parasitic device in parallel with the component, in series with the component, or between any two nodes to correct the circuit model.

When there are no components found that do not match the model, the operator may consider the model as correct and terminate the process.

7.6 Determination of Minimum List of Components

The number of known model elements required is dependent upon which components of the $K_v$ matrix are specified as known. There are two types of unknowns in Equation 39: (1) for a given column I of the matrix W, the unknowns are the k variables $x_{il}$ where k is the rank deficiency of W and (2) some of the variables $z_{il}$ in the Ith column of the Z matrix. The unknowns $z_{il}$ are indicated by the non-zero elements of $A^T$. A column i of $A^T$ always indicates the same unknown $z_{ij}$. So if equations are used wherein the non-zero elements of $A^T$ are determined by the smallest number of columns, the least number of unknowns from the Z matrix is obtained.

In a representative embodiment, the method to determine the set of equations with the shortest list of unknowns in based on the "best-first-search" technique which is also called the "priority-first search" [see R. Sedgewick, *Algorithms*, Addison-Wesley Publishing Company, Reading, Mass., 1983.]. This method consists of the following steps:

A. Start with the first equation of the system of equations described by Equation 38. Then, count the number of unknowns $z_{il}$ and $x_{il}$ in this equation, and mark this equation as "good".

B. Next, create as many sets of equations as there are equations not marked "good", where each new set of equations consists of the equation that was marked "good" and a new equation from Equation 38 which is not marked "good". Then count the number of unknowns $x_{ij}$ and $z_{ij}$ in each one of the constructed sets of equations.

C. Next, among the constructed sets of equations, select the set that has the least number of counted unknowns. Based on how the sets are constructed (see previous paragraph), only one equation in this selected set is not marked "good". Mark this equation as "good".

D. When all equations have been marked "good", then the search terminates, with the set of equations selected in Step C being the set of equations sought (i.e., this set of equations has the minimum number of unknowns). When, on the other hand, there are still equations that are not marked "good", then build new sets of equations where each new set consists of the currently selected set, augmented with one equation that is not marked "good". Then Step C above is repeated.

Recall that each equation of the system described by Equation 38 corresponds to a single diagonal element of the matrix $K_v$. Hence each equation corresponds to a single component. The set of components associated with the best set of equations determined by the above procedure is the minimum list of components that are suggested to the operator and for which the operator needs to specify known values and types. When the operator specifies values for a given component, the above procedure considers the equations associated with this component as the only equations that are initially marked "good". All the remaining equations are not marked as "good".

8. Identification of Incorrectly Specified Circuit Elements

The reader should refer to section 7 above for mathematical derivations relevant to the following discussion.

Figure 6:
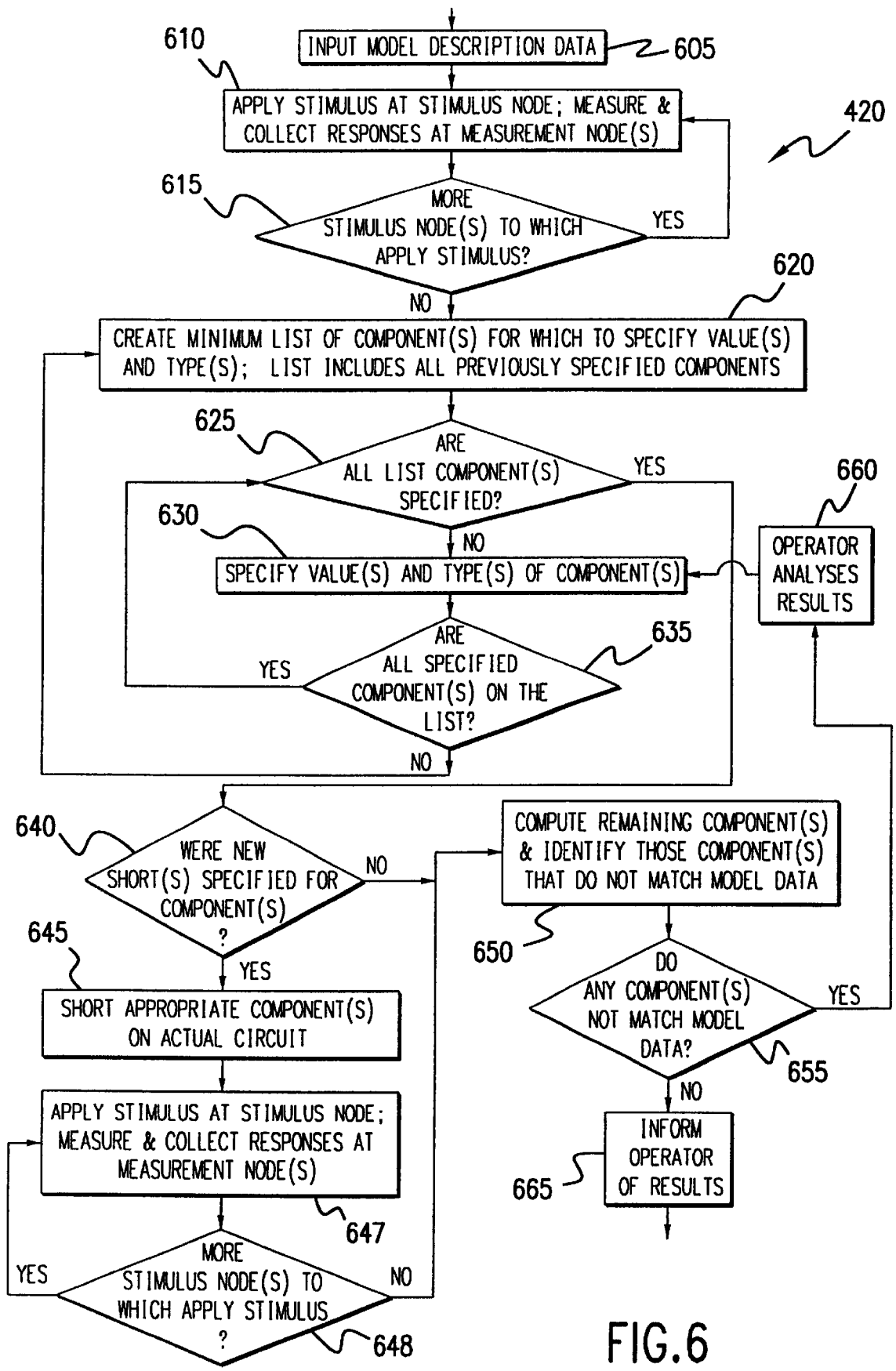
FIG. 6 is a flow chart of a method for correcting the model of an electronic circuit consistent with an embodiment of the present invention.

FIG. 6 is a flow chart of a method for correcting the model 405 of the electronic circuit 105 consistent with an embodiment of the present invention. The representative embodiment provides methods for confirming whether or not the model 405 of the electronic circuit 105 matches the circuit components 110 on the electronic circuit 105. In a representative embodiment, electrical test stimulus 407 is applied at a stimulus node 130 and measurements of electrical test responses 408 at measurement nodes 135 are performed. Measurements at the measurement nodes 135 may be of real or complex signals which are typically voltage signals. The electrical test stimulus 407 forcing these electrical test responses 408 may also be real or complex signals which are typically voltage signals, but in the representative embodiment are modeled using a Norton equivalent current source. The electrical test stimulus 407 and measurements of electrical test responses 408 are made with respect to a single designated reference node within the set of accessible nodes 125. This electrical test stimulus 407 is usually applied to stimulus nodes 130 within the cluster 200 of the electronic circuit 105, where the cluster 200 may include all circuit components 110 of the electronic circuit 105.

Block 605 is the entry block into the method and obtains input data for model elements 510 of the model 405. The information in the model elements 510 could include for example the items previously discussed which are shown in FIG. 5. This data could be obtained in electronic form from Computer Aided Design (CAD) program or could be entered via a keyboard by the operator. Block 605 then transfers control to block 610.

Block 610 applies electrical test stimulus 407 at the stimulus node 130 one at a time and measures the electrical test responses 408, which are voltages in a representative embodiment, at the measurement nodes 135 until all stimulus nodes 130 have been exhausted. Values for the electrical test stimulus 407 and corresponding electrical test responses 408 are collected and, in a representative embodiment, inputted into the model correction computer program 420. Block 610 then transfers control to block 615.

When electrical test stimulus 407 has been applied to all stimulus nodes 130, block 615 transfers control to block 620. Otherwise block 615 transfers control to block 610.

Block 620 enters values for the electrical test stimulus 407 and the measurements of responses for each electrical test stimulus 407 applied to the electronic circuit 105. Block 620 then obtains the minimum list of components 422 which the operator must specify in order, in a representative embodiment, for the software program 420 to verify the model 405 of the electronic circuit 105. This block could in a representative embodiment follow the method as explained in Section 7 above. Each time block 620 is accessed, it computes a new minimum list of components for which the values should be specified based upon the circuit topology and any previously specified circuit components 110. Any circuit components 110 previously specified as known by the operator are included on this list. Since the operator is free to specify components not on previously created lists, the list created by block 620 may, in fact, be a true minimum list only the first time it is created. Block 620 then transfers control to block 625.

When all components on the minimum list created in block 620 are specified, block 625 transfers control to block 640. Otherwise, block 625 transfers control to block 630.

Block 630 obtains input of known values and types for circuit components 110. This data could be obtained for example by various methods such as direct measurements on individual circuit components 110, by inspection of these circuit components 110, or by other means. Block 630 then transfers control to block 635.

When all specified components are on the list created in block 620, block 635 transfers control to block 625. Otherwise, block 635 transfers control to block 620.

When new short circuits are specified by the operator for circuit components 110 in the electronic circuit 105 whose model 405 is being verified, block 640 transfers control to block 645. Otherwise, block 640 transfers control to block 650.

In block 645 the operator applies short circuit(s) to the appropriate circuit components 110 of the electronic circuit 105. Block 645 then transfers control to block 647.

Block 647 applies electrical test stimulus 407 at the stimulus node 130 one at a time and measures the electrical test responses 408, which are voltages in a representative embodiment, at the measurement nodes 135 until all stimulus nodes 130 have been exhausted. Values for the electrical test stimulus 407 and corresponding electrical test responses 408 are collected and, in a representative embodiment, inputted into the model correction computer program 420. Block 647 then transfers control to block 648.

When electrical test stimulus 407 has been applied to all stimulus nodes 130, block 648 transfers control to block 650. Otherwise block 648 transfers control to block 647.

Block 650 computes predicted values for the circuit components 110 that are not on the list created in block 620 and identifies any of those circuit components 110 which do not match the model 405. Block 650 then transfers control to block 655.

When all predicted values for the circuit components 110 not on the list created in block 620, that are computed in a representative embodiment by the computer software program 420, match those of the model 405, block 655 transfers control to block 665. Otherwise, block 655 transfers control to block 660.

In block 660 the operator analyses the results of block 650 and decides which model elements 510 to modify. In a representative embodiment, the operator could choose to modify the specification of one or more model elements 510 by changing specified values, adding model elements 510, or removing model elements 510. Block 660 then transfers control to block 630 where the decisions of block 660 are implemented.

Block 665 informs the operator that all model elements 510 match the circuit components 110 of the electronic circuit 105.

9. Determination of Component Types

The ability to compute the matrix $K_v$, provides a method to determine the type of each circuit component 110 by computing the matrix $K_v$ for two different frequencies of the stimuli. Each diagonal element of $K_v$ represents the admittance of a circuit component 110. If the admittance of each circuit component 110 stays the same when the frequency is changed, then the circuit component 110 is a resistor. If the admittance increases with an increase in the frequency, then the circuit component 110 is a capacitor. If the admittance decreases with an increase in the frequency, then the circuit component 110 is an inductor.

10. Closing Discussion

A primary advantage of the method described herein over previous methods is the ability to identify suspected incorrectly modeled electronic components 110 by performing measurements only on limited numbers of nodes 120 of the electronic circuit 105 and/or specifying values for a limited number of circuit components 110. The values and types of circuit components 110 which the computer 415 calculates also indicate any circuit components 110 which may be missing from the model 405 and their approximate location. With this information, the operator can correct the model 405 of the electronic circuit 105 without having access to all the circuit components 110 and nodes 120.

A further advantage lies in the fact that there are no limits to the number of incorrectly modeled circuit components 110 which are present in the model 405 of the electronic circuit 105.

Finally, the methods described herein are capable of handling very large circuits by shorting out sections of the circuit and presenting to the operator smaller lists of components to specify. Verification of the full circuit requires individual verification of all the sections of the circuit.

Although specific embodiments of the invention have been described and illustrated, the invention is not to be limited to the specific forms or arrangements of parts so described and illustrated. The invention is limited only by the claims.

What is claimed is:

1. A method for correcting an electronic circuit model of an electronic circuit, comprising the steps of:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:
  obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;
computing the value for at least one of the model elements not on the minimum list; and
when at least one computed value is not equal to the value of the corresponding model element within specified limits:
  modifying the value of at least one model element; and repeating the method steps beginning with the method step for creating the minimum list.

2. A computer program storage medium readable by a computer, tangibly embodying a computer program of instructions executable by the computer to perform method steps for correcting an electronic circuit model of an electronic circuit, the steps comprising:
  obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;
  obtaining the value of an electrical test stimulus applied at a stimulus node on the electronic circuit and value of electrical test response measured on at least one measurement node of the electronic circuit, wherein the electrical test responses result from application of the electrical test stimulus;
  creating a minimum list, wherein the minimum list is a list comprising specified model elements used, with given values for electrical test stimulus and electrical test responses, to compute values for the model elements not on the minimum list;
  when the minimum list is not empty, obtaining the specification of at least one of the model elements;
  when at least one electronic circuit component was specified to be a short circuit:
    obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;
  computing the value for at least one of the model elements not on the minimum list; and
  when at least one computed value is not equal to the value of the corresponding model element within specified limits:
    modifying, the value of at least one model element; and repeating the method steps be-inning with the method step for creating the minimum list.

3. A method for correcting an electronic circuit model of an electronic circuit, comprising the steps of:
  obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;
  obtaining the value of an electrical test stimulus applied at a stimulus node on the electronic circuit and value of electrical test response measured on at least one measurement node of the electronic circuit, wherein the electrical test responses result from application of the electrical test stimulus;
  creating a minimum list, wherein the minimum list is a list comprising specified model elements used, with given values for electrical test stimulus and electrical test responses, to compute values for the model elements not on the minimum list and wherein a best-first-search technique is used to create the minimum list;
  when the minimum list is not empty, obtaining the specification of at least one of the model elements;
  when at least one electronic circuit component was specified to be a short circuit:
    obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;
  computing the value for at least one of the model elements not on the minimum list; and
  when at least one computed value is not equal to the value of the corresponding model element within specified limits:
    modifying the value of at least one model element; and repeating the method steps beginning with the method step for creating the minimum list.

4. A method for correcting an electronic circuit model of an electronic circuit, comprising the steps of:
  obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;
  electrically isolating a sub-cluster from the remainder of the electronic circuit;
  obtaining the value of an electrical test stimulus applied at a stimulus node on the electronic circuit and value of electrical test response measured on at least one measurement node of the electronic circuit, wherein the electrical test responses result from application of the electrical test stimulus;
  creating a minimum list, wherein the minimum list is a list comprising specified model elements used, with given values for electrical test stimulus and electrical test responses, to compute values for the model elements not on the minimum list;
  when the minimum list is not empty, obtaining the specification of at least one of the model elements;

when at least one electronic circuit component was specified to be a short circuit:
obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;
computing the value for at least one of the model elements not on the minimum list; and
when at least one computed value is not equal to the value of the corresponding model element within specified limits:
modifying the value of at least one model element; and repeating the method steps beginning with the method step for creating the minimum list.

5. A method for correcting an electronic circuit model of an electronic circuit, comprising the steps of:
obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;
obtaining the value of an electrical test stimulus applied at a stimulus node on the electronic circuit and value of electrical test response measured on at least one measurement node of the electronic circuit, wherein the electrical test responses result from application of the electrical test stimulus, via:
electrically connecting an electrical test machine to the electronic circuit,
applying the electrical test stimulus to the stimulus node on the electronic circuit, and
measuring the electrical test response to the electrical test stimulus on at least one measurement node on the electronic circuit;
creating a minimum list, wherein the minimum list is a list comprising specified model elements used, with given values for electrical test stimulus and electrical test responses, to compute values for the model elements not on the minimum list;
when the minimum list is not empty, obtaining the specification of at least one of the model elements;
when at least one electronic circuit component was specified to be a short circuit:
obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;
computing the value for at least one of the model elements not on the minimum list; and
when at least one computed value is not equal to the value of the corresponding model element within specified limits:
modifying the value of at least one model element; and repeating the method steps beginning with the method step for creating the minimum list.

6. A method for correcting an electronic circuit model of an electronic circuit, comprising the steps of:
obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;
obtaining the value of an electrical test stimulus applied at a stimulus node on the electronic circuit and value of electrical test response measured on at least one measurement node of the electronic circuit, wherein the electrical test responses result from application of the electrical test stimulus, via:
electrically connecting an electrical test machine to the electronic circuit,
applying the electrical test stimulus at a first frequency to the stimulus node on the electronic circuit,
measuring the electrical test response to the electrical test stimulus at the first frequency on at least one measurement node on the electronic circuit,
applying the electrical test stimulus to the stimulus node on the electronic circuit at a second frequency which differs from the first frequency,
measuring the electrical test response to the electrical test stimulus at the second frequency at one of the measurement nodes on the electronic circuit, and
determining whether the electronic circuit component is a resistor, a capacitor, or an inductor;
creating a minimum list, wherein the minimum list is a list comprising specified model elements used, with given values for electrical test stimulus and electrical test responses, to compute values for the model elements not on the minimum list;
when the minimum list is not empty, obtaining the specification of at least one of the model elements;
when at least one electronic circuit component was specified to be a short circuit:
obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;
computing the value for at least one of the model elements not on the minimum list; and
when at least one computed value is not equal to the value of the corresponding model element within specified limits:
modifying the value of at least one model element; and repeating the method steps beginning with the method step for creating the minimum list.

7. A method for correcting an electronic circuit model of an electronic circuit, comprising the steps of:
obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus, via:

electrically connecting an electrical test machine to the electronic circuit, applying the electrical test stimulus to the stimulus node on the electronic circuit, providing the magnitude of the electrical test stimulus applied to the stimulus node in the step applying the electrical test stimulus is less than that required to turn on an active electronic device on the electronic circuit, and measuring the electrical test response to the electrical test stimulus on at least one measurement node on the electronic circuit;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

8. A method for correcting an electronic circuit model of an electronic circuit, comprising the steps of:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus, via:

electrically connecting an electrical test machine to the electronic circuit, applying the electrical test stimulus to the stimulus node on the electronic circuit, providing the electrical test stimulus is a voltage, and measuring the electrical test response to the electrical test stimulus on at least one measurement node on the electronic circuit, providing the electrical test response is a voltage;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

9. A method for correcting an electronic circuit model of an electronic circuit, comprising the steps of:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus, via:

electrically connecting an electrical test machine to the electronic circuit, applying the electrical test stimulus to the stimulus node on the electronic circuit, providing the electrical test stimulus is a voltage of magnitude less than 0.7 volts, and measuring the electrical test response to the electrical test stimulus on at least one measurement node on the electronic circuit, providing the electrical test response is a voltage;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

10. A method for correcting an electronic circuit model of an electronic circuit, comprising the steps of:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together via:

electrically connecting an electrical test machine to the electronic circuit, shorting together the nodes of the electronic circuit component specified to be a short circuit in the electronic circuit model, applying the electrical test stimulus to the stimulus node on the electronic circuit, and measuring the electrical test response to the electrical test stimulus at measurement nodes on the electronic circuit;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

11. A method for correcting an electronic circuit model of an electronic circuit, comprising the steps of:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together via:

electrically connecting an electrical test machine to the electronic circuit, shorting together the nodes of the electronic circuit component specified to be a short circuit in the electronic circuit model, applying the electrical test stimulus to the stimulus node on the electronic circuit at a first frequency, measuring the electrical test response to the electrical test stimulus at measurement nodes on the electronic circuit, applying the electrical test stimulus to the stimulus node on the electronic circuit at a second frequency which differs from the first frequency, measuring the electrical test response to the electrical test stimulus at a measurement node on the electronic circuit, and determining whether the electronic circuit component is a resistor, a capacitor, or an inductor;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

12. A method for correcting an electronic circuit model of an electronic circuit, comprising the steps of:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:
    obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together via:
        electrically connecting an electrical test machine to the electronic circuit,
        shorting together the nodes of the electronic circuit component specified to be a short circuit in the electronic circuit model,
        applying the electrical test stimulus to the stimulus node on the electronic circuit, providing the magnitude of the electrical test stimulus applied is less than that required to turn on an active electronic device on the electronic circuit, and
        measuring the electrical test response to the electrical test stimulus at measurement nodes on the electronic circuit;

computing the value for at least one of the model elements not on the minimum list; and when at least one computed value is not equal to the value of the corresponding model element within specified limits:
    modifying the value of at least one model element; and
    repeating the method steps beginning with the method step for creating the minimum list.

13. A method for correcting an electronic circuit model of an electronic circuit, comprising the steps of:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:
    obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together via:
        electrically connecting an electrical test machine to the electronic circuit,
        shorting together the nodes of the electronic circuit component specified to be a short circuit in the electronic circuit model,
        applying the electrical test stimulus to the stimulus node on the electronic circuit, providing the electrical test stimulus is a voltage, and
        measuring the electrical test response to the electrical test stimulus at measurement nodes on the electronic circuit, providing the electrical test response is a voltage;

computing the value for at least one of the model elements not on the minimum list; and when at least one computed value is not equal to the value of the corresponding model clement within specified limits:
    modifying the value of at least one model element; and
    repeating the method steps beginning with the method step for creating the minimum list.

14. A method for correcting an electronic circuit model of an electronic circuit, comprising the steps of:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together via:
electrically connecting an electrical test machine to the electronic circuit,
shorting together the nodes of the electronic circuit component specified to be a short circuit in the electronic circuit model,
applying the electrical test stimulus to the stimulus node on the electronic circuit, providing the electrical test stimulus is a voltage of magnitude less than 0.7 volts, and
measuring the electrical test response to the electrical test stimulus at measurement nodes on the electronic circuit, providing the electrical test response is a voltage;

computing the value for at least one of the model elements not on the minimum list; and when at least one computed value is not equal to the value of the corresponding model element within specified limits:
modifying the value of at least one model element; and
repeating the method steps beginning with the method step for creating the minimum list.

15. A method for connecting an electronic circuit model of an electronic circuit, comprising the steps of:

obtaining descriptive data for the electronic circuit model, wherein the electronic circuit model comprises a plurality of interconnected model elements each of which describes an electronic circuit component of the electronic circuit;

obtaining the value of an electrical test stimulus applied at a stimulus node on the electronic circuit and value of resulting electrical test response measured on at least one measurement node of the electronic circuit;

creating a minimum list, wherein the minimum list is a list comprising specified model elements, values for electrical test stimulus, and electrical test responses;

computing the value for at least one of the model elements not on the minimum list; and when at least one computed value is not equal to the value of the corresponding model element within specified limits:
modifying the value of at least one model element; and
repeating the method steps beginning with the method step for creating the minimum list.

16. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list and wherein a best-first-search technique is used to create the minimum list;

when the minimum list is not empty, obtaining the specification of at least one of the model elements;

when at least one electronic circuit component was specified to be a short circuit:
obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;

computing the value for at least one of the model elements not on the minimum list; and when at least one computed value is not equal to the value of the corresponding model element within specified limits:
modifying the value of at least one model element; and
repeating the method steps beginning with the method step for creating the minimum list.

17. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

electrically isolating a sub-cluster from the remainder of the electronic circuit;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:
obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

18. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus, via:

electrically connecting an electrical test machine to the electronic circuit, applying the electrical test stimulus to the stimulus node on the electronic circuit, and measuring the electrical test response to the electrical test stimulus on at least one measurement node on the electronic circuit;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

19. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus, via:

electrically connecting an electrical test machine to the electronic circuit, applying the electrical test stimulus at a first frequency to the stimulus node on the electronic circuit, measuring the electrical test response to the electrical test stimulus at the first frequency on at least one measurement node on the electronic circuit, applying the electrical test stimulus to the stimulus node on the electronic circuit at a second frequency which differs from the first frequency, measuring the electrical test response to the electrical test stimulus at the second frequency at one of the measurement nodes on the electronic circuit, and determining whether the electronic circuit component is a resistor, a capacitor, or an inductor;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

20. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus, via:

electrically connecting an electrical test machine to the electronic circuit, applying the electrical test stimulus to the stimulus node on the electronic circuit, providing the magnitude of the electrical test stimulus applied to the stimulus node in the step applying the electrical test stimulus is less than that required to turn on an active electronic device on the electronic circuit, and measuring the electrical test response to the electrical test stimulus on at least one measurement node on the electronic circuit;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

21. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus, via:

electrically connecting an electrical test machine to the electronic circuit, applying the electrical test stimulus to the stimulus node on the electronic circuit, providing the electrical test stimulus is a voltage, and measuring the electrical test response to the electrical test stimulus on at least one measurement node on the electronic circuit, providing the electrical test response is a voltage;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;

computing the value for at least one of the model elements not on the minimum list; and when at least one computed value is not equal to the value of the corresponding model element within specified limits:

modifying the value of at least one model clement; and repeating the method steps beginning with the method step for creating the minimum list.

22. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus, via:

electrically connecting an electrical test machine to the electronic circuit, applying the electrical test stimulus to the stimulus node on the electronic circuit, providing the electrical test stimulus is a voltage of magnitude less than 0.7 volts, and measuring the electrical test response to the electrical test stimulus on at least one measurement node on the electronic circuit, providing the electrical test response is a voltage;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

23. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together via:

electrically connecting an electrical test machine to the electronic circuit, shorting together the nodes of the electronic circuit component specified to be a short circuit in the electronic circuit model, applying the electrical test stimulus to the stimulus node on the electronic circuit, and measuring the electrical test response to the electrical test stimulus at measurement nodes on the electronic circuit;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

24. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together via:

electrically connecting an electrical test machine to the electronic circuit, shorting together the nodes of the electronic circuit component specified to be a short circuit in the electronic circuit model, applying the electrical test stimulus to the stimulus node on the electronic circuit at a first frequency, measuring the electrical test response to the electrical test stimulus at measurement nodes on the electronic circuit, applying the electrical test stimulus to the stimulus node on the electronic circuit at a second frequency which differs from the first frequency, measuring the electrical test response to the electrical test stimulus at a measurement node on the electronic circuit, and determining whether the electronic circuit component is a resistor, a capacitor, or an inductor;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

25. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together via:

electrically connecting an electrical test machine to the electronic circuit, shorting together the nodes of the electronic circuit component specified to be a short circuit in the electronic circuit model, applying the electrical test stimulus to the stimulus node on the electronic circuit, providing the magnitude of the electrical test stimulus applied is less than that required to turn on an active electronic device on the electronic circuit, and measuring the electrical test response to the electrical test stimulus at measurement nodes on the electronic circuit;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

26. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:

obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together via:

electrically connecting an electrical test machine to the electronic circuit, shorting together the nodes of the electronic circuit component specified to be a short circuit in the electronic circuit model, applying the electrical test stimulus to the stimulus node on the electronic circuit, providing the electrical test stimulus is a voltage, and measuring the electrical test response to the electrical test stimulus at measurement nodes on the electronic circuit, providing the electrical test response is a voltage;

computing the value for at least one of the model elements not on the minimum list; and when at least one computed value is not equal to the value of the corresponding model element within specified limits:

modifying the value of at least one model element; and repeating the method steps beginning with the method step for creating the minimum list.

27. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit, the electronic circuit component having two nodes and the electronic circuit comprising a plurality of interconnected electronic circuit components and having at least one stimulus node and at least one measurement node;

obtaining the value of an electrical test stimulus applied at a stimulus node on the electronic circuit and value of electrical test response measured on at least one measurement node of the electronic circuit, wherein the electrical test responses result from application of the electrical test stimulus;

creating a minimum list, wherein the minimum list is a list comprising specified model elements used, with given values for electrical test stimulus and electrical test responses, to compute values for the model elements not on the minimum list;

when the minimum list is not empty, obtaining the specification of at least one of the model elements;

when at least one electronic circuit component was specified to be a short circuit:
  obtaining the value of the electrical test stimulus applied at the stimulus node on the electronic circuit and values of electrical test responses measured on at least one measurement node of the electronic circuit, wherein the electrical test responses result from application of the electrical test stimulus and wherein the electronic circuit component specified to be a short circuit has its two nodes shorted together via:
    electrically connecting an electrical test machine to the electronic circuit,
    shorting together the nodes of the electronic circuit component specified to be a short circuit in the electronic circuit model,
    applying the electrical test stimulus to the stimulus node on the electronic circuit, providing the electrical test stimulus is a voltage of magnitude less than 0.7 volts, and
    measuring the electrical test response to the electrical test stimulus at measurement nodes on the electronic circuit, providing the electrical test response is a voltage;

computing the value for at least one of the model elements not on the minimum list; and when at least one computed value is not equal to the value of the corresponding model element within specified limits:
  modifying the value of at least one model element; and
  repeating the method steps beginning with the method step for creating the minimum list.

28. A computer program storage medium readable by a computer, tangibly embodying a computer program of instructions executable by the computer to perform method steps for correcting an electronic circuit model of an electronic circuit, the steps comprising:

obtaining descriptive data for the electronic circuit model, wherein the electronic circuit model comprises a plurality of interconnected model elements each of which describes an electronic circuit component of the electronic circuit;

obtaining the value of an electrical test stimulus applied at a stimulus node on the electronic circuit and value of resulting electrical test response measured on at least one measurement node of the electronic circuit;

creating a minimum list, wherein the minimum list is a list comprising specified model elements, values for electrical test stimulus, and electrical test responses;

computing the value for at least one of the model elements not on the minimum list; and when at least one computed value is not equal to the value of the corresponding model element within specified limits:
  modifying the value of at least one model element; and
  repeating the method steps beginning with the method step for creating the minimum list.

* * * * *